(12) United States Patent
Huang

(10) Patent No.: US 12,396,239 B2
(45) Date of Patent: Aug. 19, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventor: Yu-Lien Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 556 days.

(21) Appl. No.: 17/722,381

(22) Filed: Apr. 17, 2022

(65) Prior Publication Data

US 2023/0335610 A1     Oct. 19, 2023

(51) Int. Cl.
*H10D 64/27* (2025.01)
*H10D 30/01* (2025.01)
(Continued)

(52) U.S. Cl.
CPC ......... *H10D 64/518* (2025.01); *H10D 30/024* (2025.01); *H10D 30/6211* (2025.01); *H10D 30/6219* (2025.01); *H10D 62/151* (2025.01); *H10D 64/017* (2025.01); *H10D 84/017* (2025.01); *H10D 84/0186* (2025.01);
(Continued)

(58) Field of Classification Search
CPC ........... H01L 29/42376; H01L 29/0847; H01L 29/41791; H01L 29/66545; H01L 29/66795; H01L 29/7851; H01L 29/165; H01L 29/665; H01L 29/7848; H01L 29/088; H01L 21/823814; H01L 21/823821; H01L 21/823871; H01L 21/76883; H01L 21/76834; H01L 21/76897; H01L 21/823431; H01L 21/823475; H01L 21/823468; H01L 27/0924; H01L 27/0886; H01L 27/088; H01L 23/481; H01L 23/5283; H10D 30/6219; H10D 30/6211; H10D 30/024; H10D 64/518; H10D 64/017;
(Continued)

(56) References Cited

U.S. PATENT DOCUMENTS 9,093,530 B2   7/2015   Huang et al.
9,171,929 B2   10/2015   Lee et al.
(Continued)

*Primary Examiner* — Britt D Hanley
*Assistant Examiner* — Casey Paul Boatman
(74) *Attorney, Agent, or Firm* — NZ Carr Law Office

(57) ABSTRACT

Embodiments of the present disclosure relates to a semiconductor device structure, including a first gate dielectric layer having a top surface and a corner surface, wherein a highest point of the top surface of the first gate dielectric layer is at a first elevation. The semiconductor device structure includes a first gate electrode layer having a top surface, wherein a highest point of the top surface of the first gate electrode layer is at a second elevation higher than the first elevation. The semiconductor device structure includes a first dielectric cap layer in contact with the top surface and the corner surface of the first gate dielectric layer. The first dielectric cap layer is also in contact with the top surface of the first gate electrode layer. The semiconductor device structure includes a first gate spacer in contact with the first dielectric cap layer and the first gate dielectric layer.

18 Claims, 21 Drawing Sheets

(51) Int. Cl.
*H10D 30/62* (2025.01)
*H10D 62/13* (2025.01)
*H10D 64/01* (2025.01)
*H10D 84/01* (2025.01)
*H10D 84/03* (2025.01)
*H10D 84/85* (2025.01)

(52) U.S. Cl.
CPC ....... *H10D 84/0193* (2025.01); *H10D 84/038* (2025.01); *H10D 84/853* (2025.01)

(58) Field of Classification Search
CPC ............. H10D 84/017; H10D 84/0186; H10D 84/0193; H10D 84/038; H10D 84/853
See application file for complete search history.

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,957,779 B2 | 3/2021 | Lo et al. |
| 11,075,279 B2 * | 7/2021 | Liao ................... H10D 30/6211 |
| 2011/0024907 A1 * | 2/2011 | Fujiyama .............. H01L 23/544 257/E21.585 |
| 2018/0033866 A1 * | 2/2018 | Liao ................. H01L 21/76897 |
| 2018/0096850 A1 * | 4/2018 | Lu ..................... H01L 21/76832 |

* cited by examiner

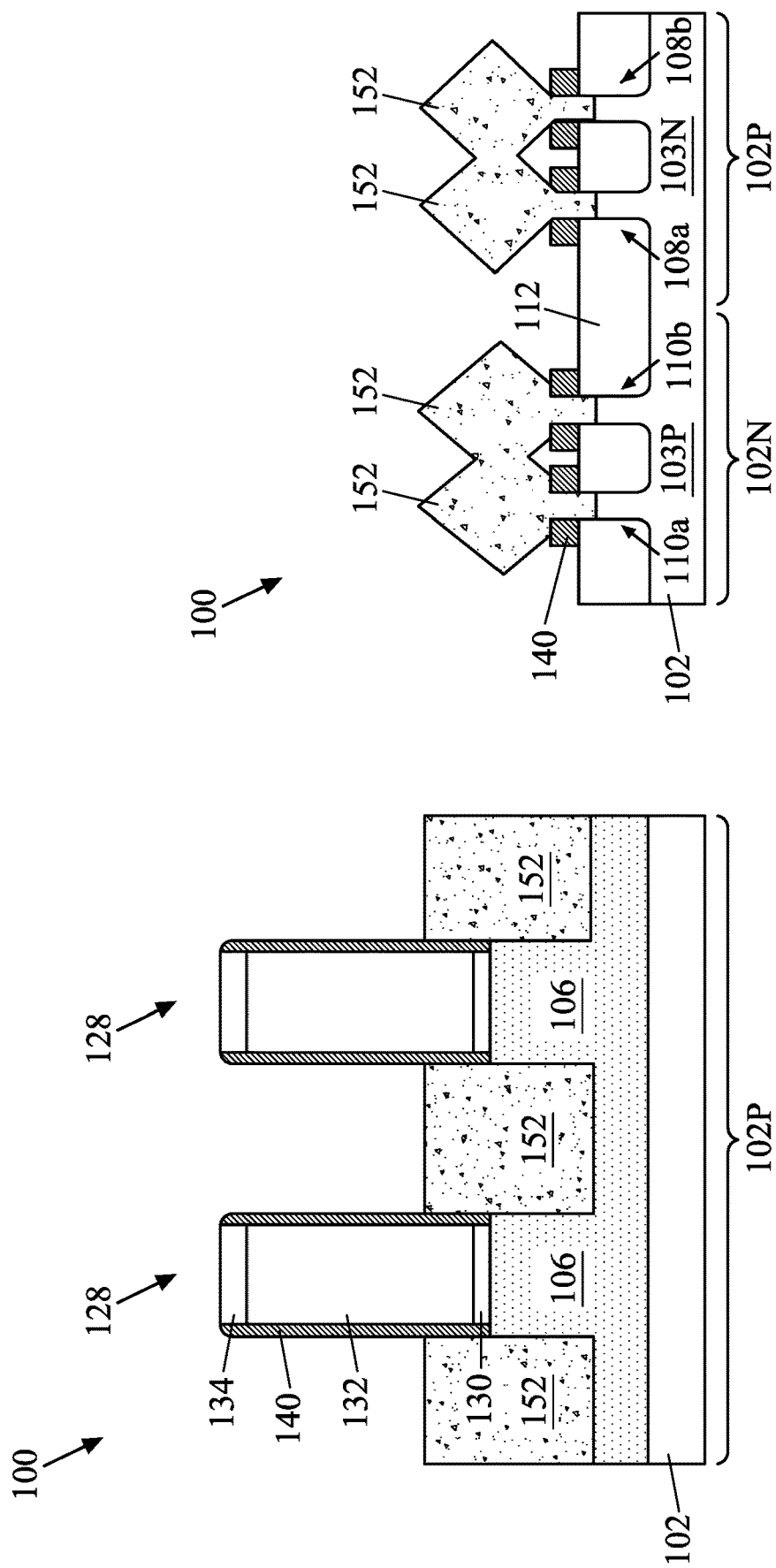

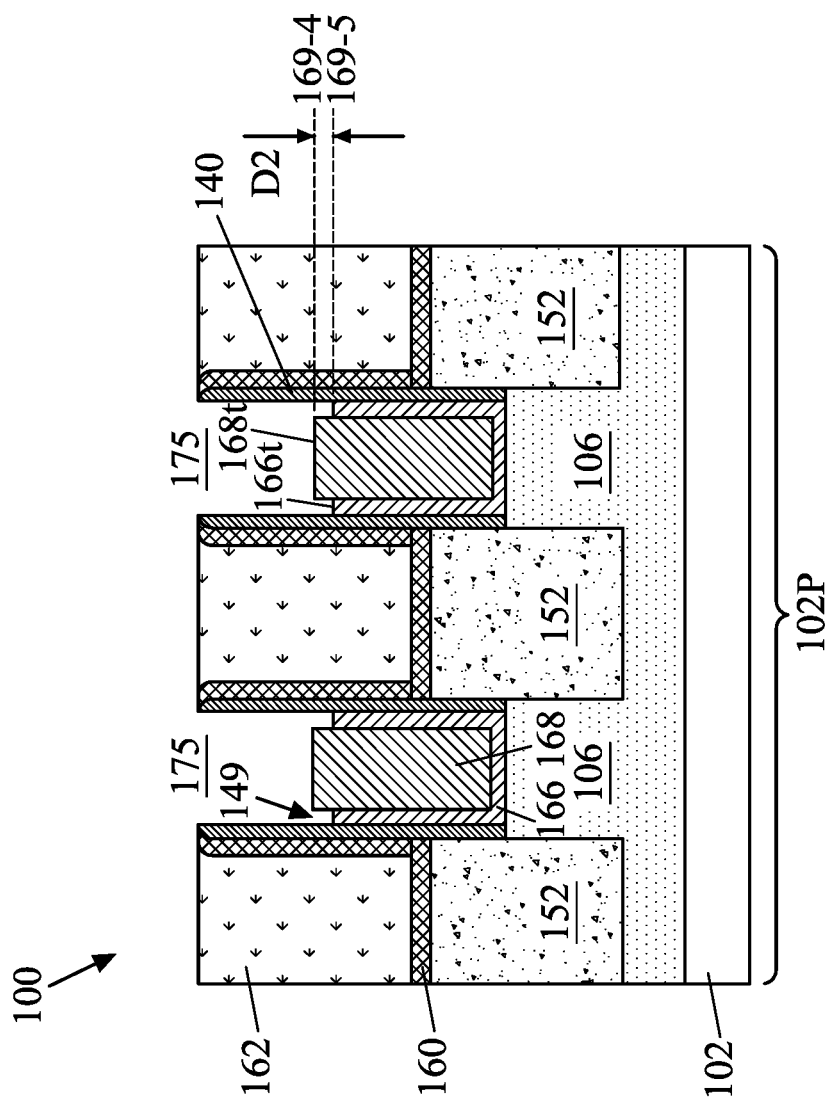
FIG. 10B-3 (Alternative Embodiment)

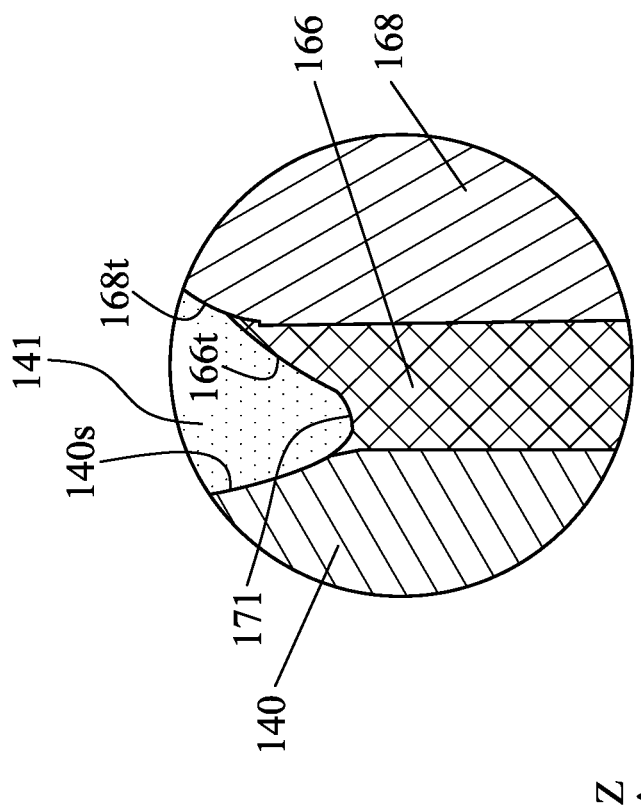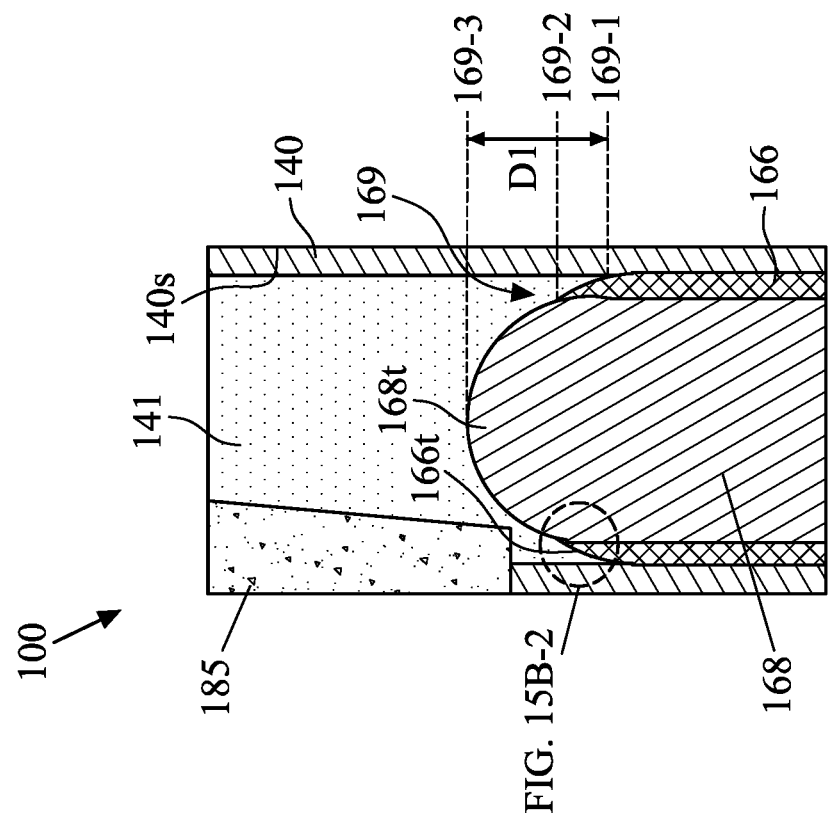
FIG. 15B-2
FIG. 15B-1

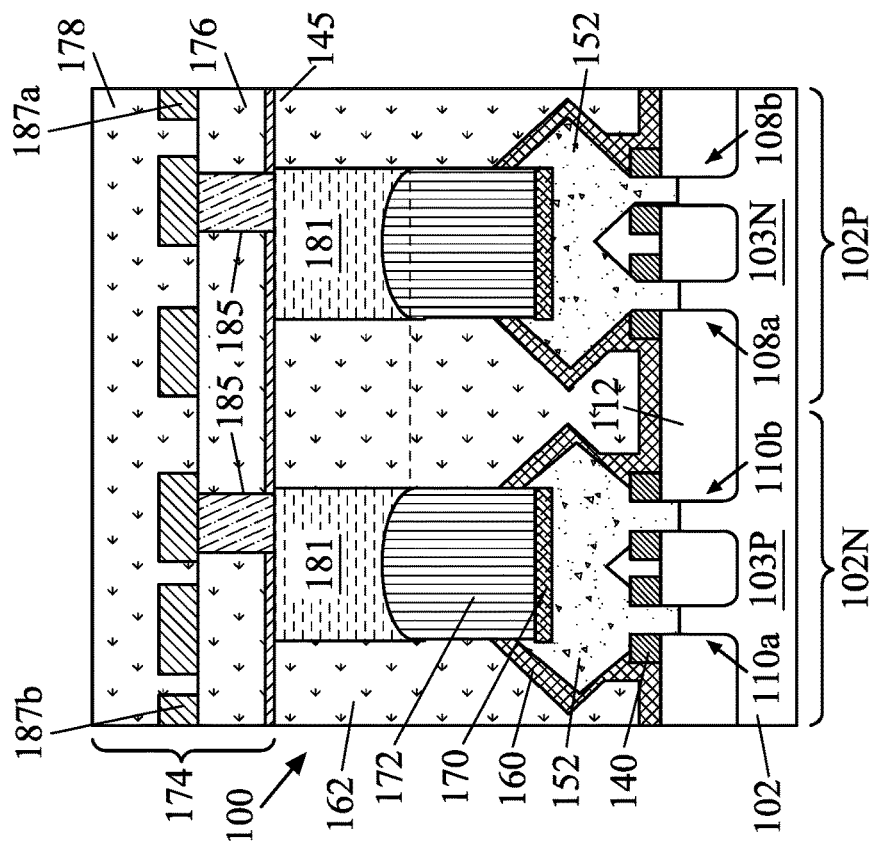
FIG. 16A (Alternative Embodiment)
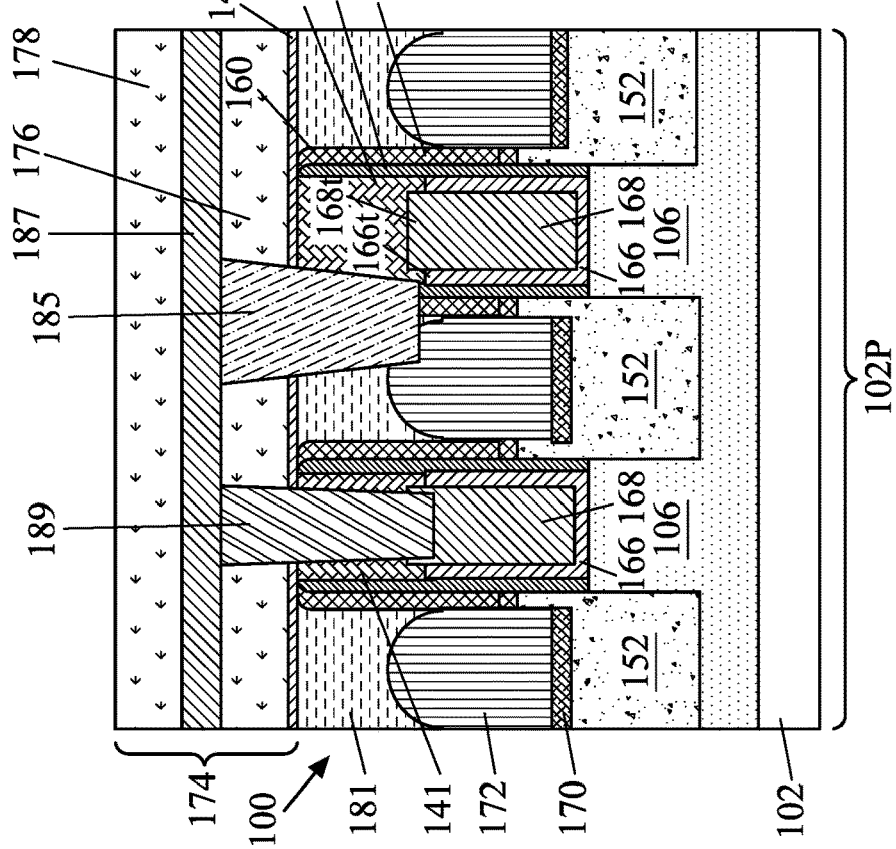
FIG. 16B (Alternative Embodiment)

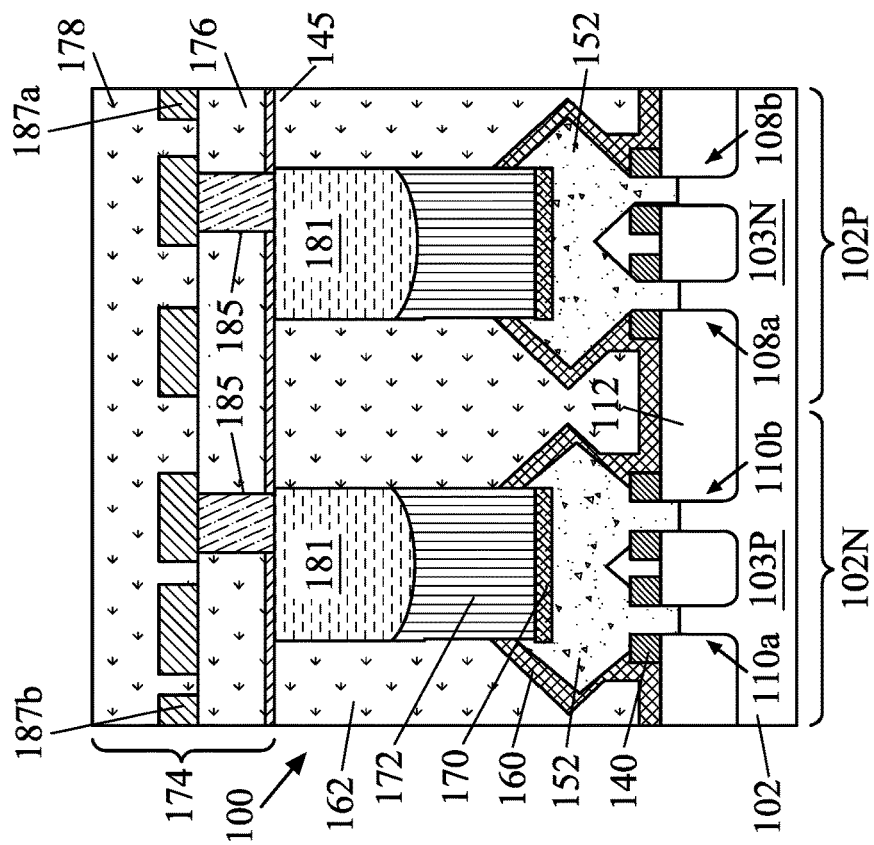
FIG. 17A (Alternative Embodiment)
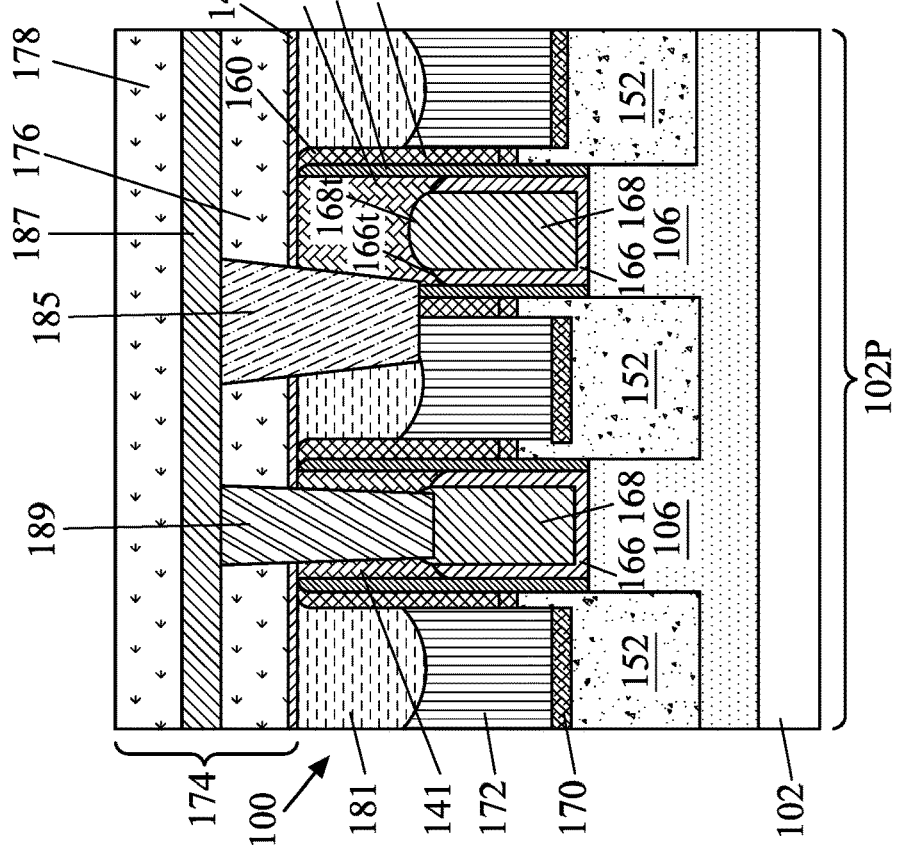
FIG. 17B (Alternative Embodiment)

(Alternative Embodiment)

(Alternative Embodiment)

SEMICONDUCTOR DEVICE STRUCTURE AND METHODS OF FORMING THE SAME

BACKGROUND

An integrated circuit (IC) typically includes a plurality of semiconductor devices, such as field-effect transistors and metal interconnection layers formed on a semiconductor substrate. The semiconductor industry has experienced continuous rapid growth due to constant improvements in the performance of various electronic components, including the gates which are used to alter the flow of current between a source and a drain. However, the metal gates and source/drain contacts may suffer from bridge (leakage) caused by variation of critical dimension (CD) or misalignment of contact vias during processing of the ICs. Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-18A are cross-sectional side views of various stages of manufacturing the semiconductor device structure of FIG. 4 taken along cross-section A-A, in accordance with some embodiments.

FIGS. 5B-18B are cross-sectional side views of various stages of manufacturing the semiconductor device structure of FIG. 4 taken along cross-section B-B, in accordance with some embodiments.

FIG. 10B-1 is an enlarged view of a portion of the semiconductor device structure in accordance with some embodiments.

FIG. 10B-2 is an enlarged view of a portion of the gate spacers and the gate dielectric layer in accordance with some embodiments.

FIG. 10B-3 illustrates an alternative embodiment in which gate electrode layers and the gate dielectric layers are etched to have a flat surface in accordance with some embodiments.

FIGS. 15B-1 is an enlarged view of a portion of the replacement gate structure in accordance with some embodiments.

FIG. 15B-2 is an enlarged view showing a portion of the semiconductor device structure adjacent the gate electrode layer in accordance with some embodiments.

DETAILED DESCRIPTION

Figure 1:
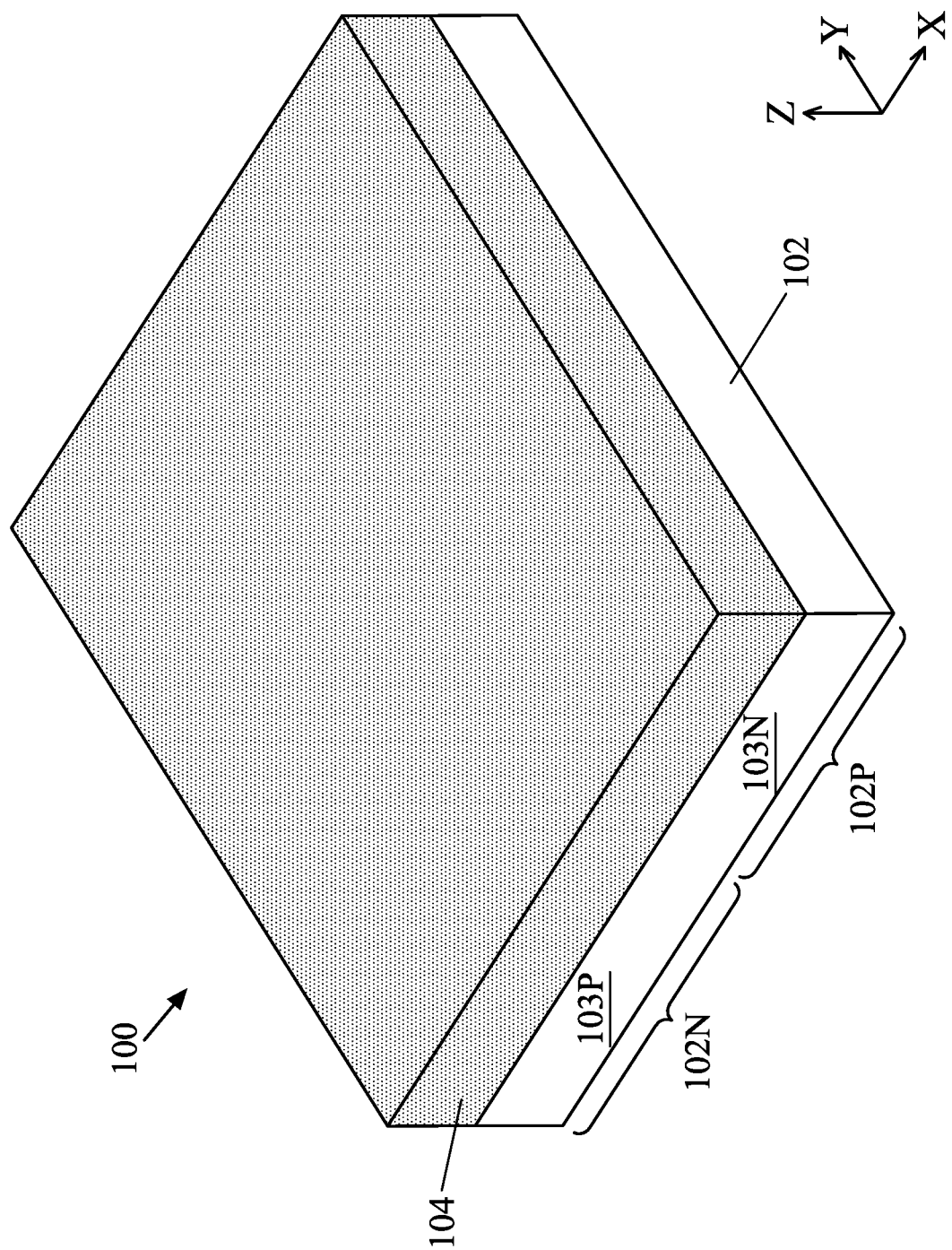
FIGS. 1-4 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-16B illustrate various stages of manufacturing a semiconductor device structure 100 in accordance with various embodiments of this disclosure. It is understood that additional operations can be provided before, during, and after processes shown by FIGS. 1-16B and some of the operations described below can be replaced or eliminated, for additional embodiments of the method. The order of the operations/processes may be interchangeable.

FIGS. 1-4 are perspective views of various stages of manufacturing a semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type region 102P and an N-type region 102N adjacent to the P-type region 102P, and the P-type region 102P and N-type region 102N belong to a continuous substrate 102, in accordance with some embodiments. In some embodiments of the present disclosure, the P-type region 102P is used to form a PMOS device thereon, whereas the N-type region 102N is used to form an NMOS device thereon. In some embodiments, an N-well region 103N and a P-well region 103P are formed in the substrate 102, as shown in FIG. 1. For example, the N-well region 103N may be formed in the substrate 102 in the P-type region 102P, whereas the P-well region 103P may be formed in the substrate 102 in the N-type region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In one exemplary embodiment, the first semiconductor layer 104 is made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 2:
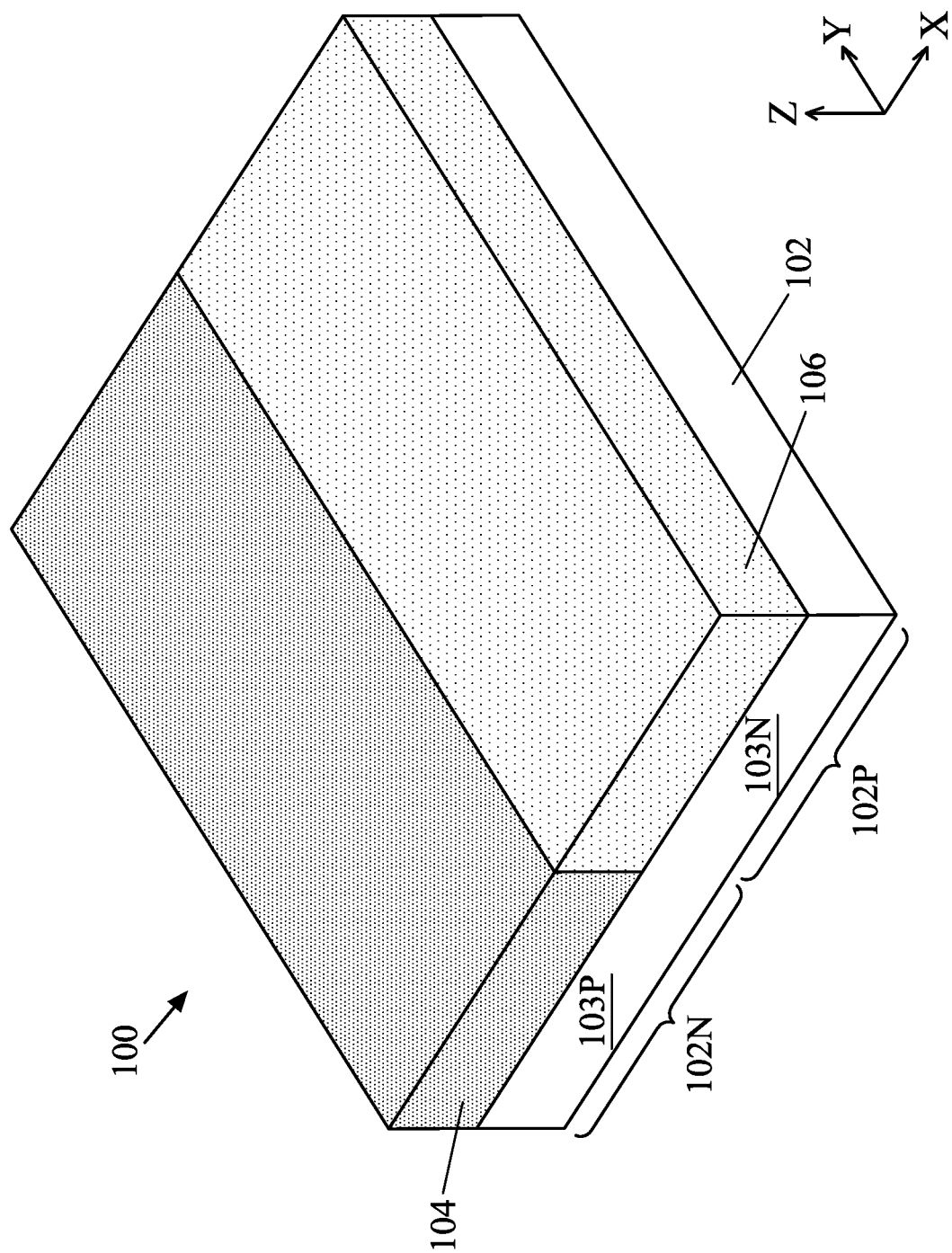

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In one exemplary embodiment, the second semiconductor layer 106 is made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the N-type region 102N, and the second semiconductor layer 106 is disposed over the N-well region 103N in the P-type region 102P.

Portions of the first semiconductor layer 104 may serve as channels in the subsequently formed NMOS device in the N-type region 102N. Portions of the second semiconductor layer 106 may serve as channels in the subsequently formed PMOS device in the P-type region 102P. In some embodiments, the NMOS device and the PMOS device are FinFETs. While embodiments described in this disclosure are described in the context of FinFETs, implementations of some aspects of the present disclosure may be used in other processes and/or in other devices, such as planar FETs, dual-gate FETs, tri-gate FETS, nanosheet channel FETs, forksheet FETs, Horizontal Gate All Around (HGAA) FETs, Vertical Gate All Around (VGAA) FETs, complementary FETs, negative-capacitance FETs, and other suitable devices.

Figure 3:
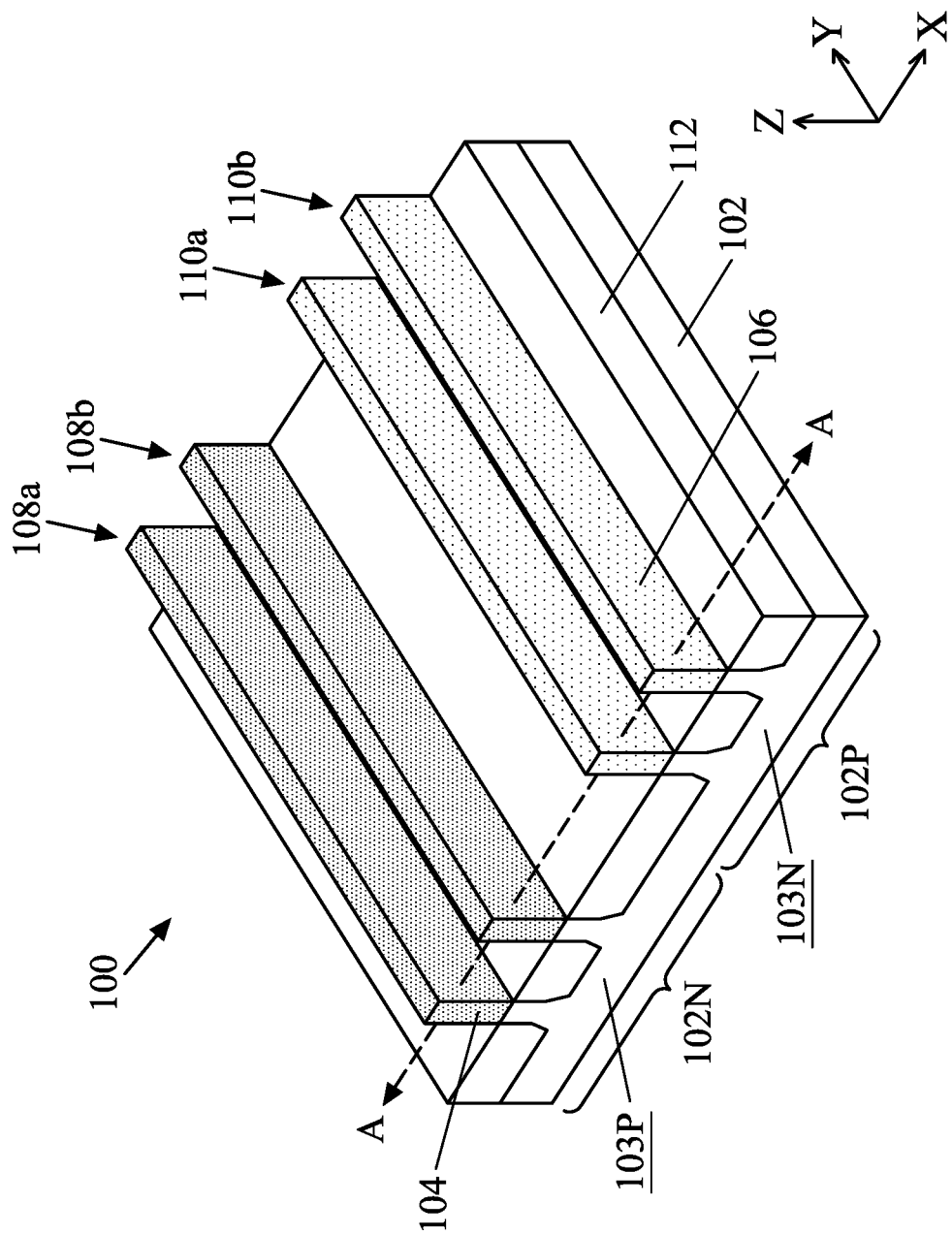

In FIG. 3, a plurality of fins 108a, 108b, 110a, 110b are formed from the first and second semiconductor layers 104, 106, respectively, and STI regions 121 are formed. The fins 108a, 108b, 110a, 110b may be patterned by any suitable method. For example, the fins 108a, 108b, 110a, 110b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108a, 108b may each include the first semiconductor layer 104, and a portion of the first semiconductor layer 104 may serve as an NMOS channel. Each fin 108a, 108b may also include the P-well region 103P. Likewise, the fins 110a, 110b may each include the second semiconductor layer 106, and a portion of the second semiconductor layer 106 may serve as a PMOS channel. Each fin 110a, 110b may also include the N-well region 103N. A mask (not shown) may be formed on the first and second semiconductor layers 104, 106, and may remain on the fins 108a-b and 110a-b.

Once the fins 108a-b, 110a-b are formed, an insulating material 112 is formed between adjacent fins 108a-b, 110a-b. The insulating material 112 may be first formed between adjacent fins 108a-b, 110a-b and over the fins 108a-b, 110a-b, so the fins 108a-b, 110a-b are embedded in the insulating material 112. A planarization process, such as a chemical-mechanical polishing (CMP) process may be performed to expose the top of the fins 108a-b, 110a-b. In some embodiments, the planarization process exposes the top of the mask (not shown) disposed on the fins 108a-b and 110a-b. The insulating material 112 are then recessed by removing a portion of the insulating material 112 located on both sides of each fin 108a-b, 110a-b. The insulating material 112 may be recessed by any suitable removal process, such as dry etch or wet etch that selectively removes the insulating material 112 but does not substantially affect the semiconductor materials of the fins 108a-b, 110a-b. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD). The insulating material 112 may be shallow trench isolation (STI) region, and is referred to as STI region 121 in this disclosure.

In some alternative embodiments, instead of forming first and second semiconductor layers 104, 106 over the substrate 102, the fins 108a-b, 110a-b may be formed by first forming isolation regions (e.g., STI regions 121) on a bulk substrate (e.g., substrate 102). The formation of the STI regions may include etching the bulk substrate to form trenches, and filling the trenches with a dielectric material to form the STI regions. The portions of the substrate between neighboring STI regions form the fins. The top surfaces of the fins and the top surfaces of the STI regions may be substantially level with each other by a CMP process. After the STI regions are formed, at least top portions of, or substantially entireties of, the fins are removed. Accordingly, recesses are formed between STI regions. The bottom surfaces of the STI regions may be level with, higher, or lower than the bottom surfaces of the STI regions. An epitaxy is then performed to separately grow first and second semiconductor layers (e.g., first and second semiconductor layers 104, 106) in the recesses created as a result of removal of the portions of the fins, thereby forming fins (e.g., fins 108a-b, 110a-b). A CMP is then performed until the top surfaces of the fins and the top surfaces of the STI regions are substantially co-planar. In some embodiments, after the epitaxy and the CMP, an implantation process is performed to define well regions (e.g., P-well region 103P and N-well region 103N) in the substrate. Alternatively, the fins are in-situ doped with impurities (e.g., dopants having P-type or N-type conductivity) during the epitaxy. Thereafter, the STI regions are recessed so that fins of first and second semiconductor layers (e.g., fins 108a-b, 110a-b) are extending upwardly over the STI regions from the substrate, in a similar fashion as shown in FIG. 3.

In some alternative embodiments, one of the fins 108a-b (e.g., fin 108a) in the N-type region 102N is formed of the second semiconductor layer 106, and the other fin 108b in the N-type region 102N is formed of the first semiconductor layer 104. In such cases, the subsequent S/D epitaxial features 152 formed on the fins 108a and 108b in the N-type region 102N may be Si or SiP; the subsequent S/D epitaxial features 152 formed on the fins 110a and 110b in the P-type region 102P may be SiGe. In some alternative embodiments, the fins 108a-b and 110a-b are formed directly from a bulk substrate (e.g., substrate 102), which may be doped with P-type or N-type impurities to form well regions (e.g., P-well region 103P and N-well region 103N). In such cases, the fins are formed of the same material as the substrate 102. In one exemplary embodiment, the fins and the substrate 102 are formed of silicon.

Figure 4:
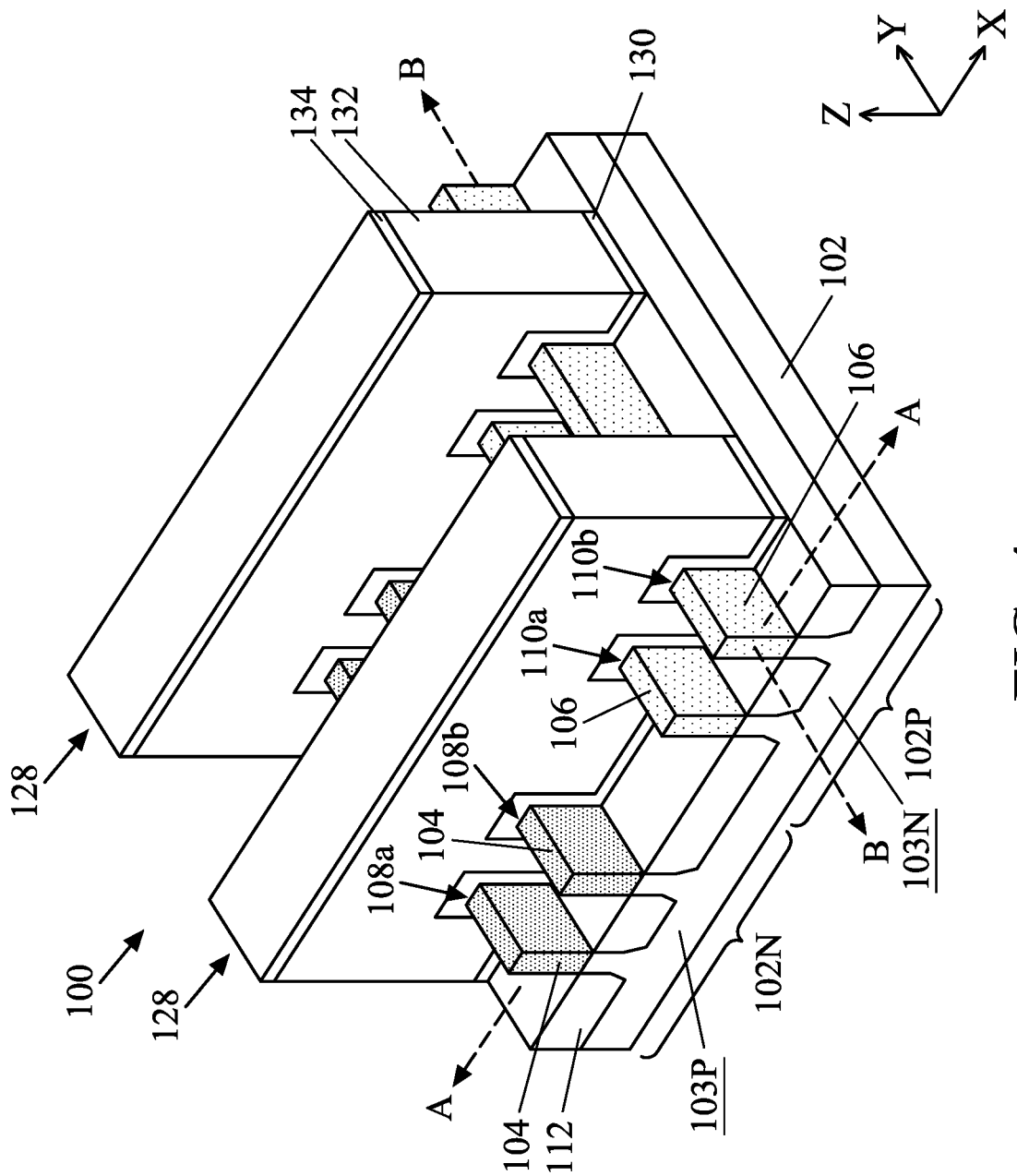

In FIG. 4, one or more sacrificial gate stacks 128 are formed on a portion of the fins 108a-b, 110a-b. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-b, 110a-b are partially exposed on opposite sides of the sacrificial gate stacks 128. While two sacrificial gate stacks 128 are shown in FIG. 4, it can be appreciated that they are for illustrative purpose only and any number of the sacrificial gate stacks 128 may be formed.

FIGS. 5A-16A are cross-sectional side views of various stages of manufacturing the semiconductor device structure 100 of FIG. 4 taken along cross-section A-A, in accordance with some embodiments. FIGS. 5B-16B are cross-sectional side views of various stages of manufacturing the semiconductor device structure 100 of FIG. 4 taken along cross-section B-B, in accordance with some embodiments. Cross-section B-B is in a plane of the fin 110b along the X direction. Cross-section A-A is in a plane perpendicular to cross-section B-B and is in the S/D epitaxial features 152 (FIG. 6A) along the Y-direction.

Figure 5A:
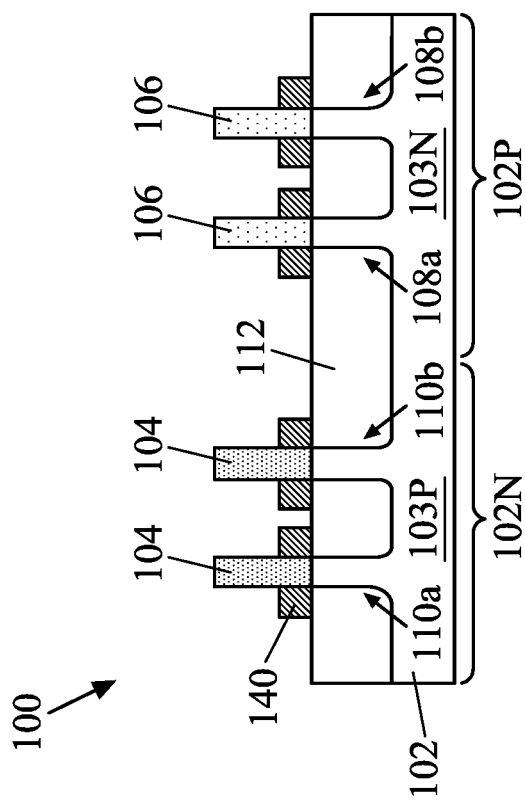
Figure 5B:
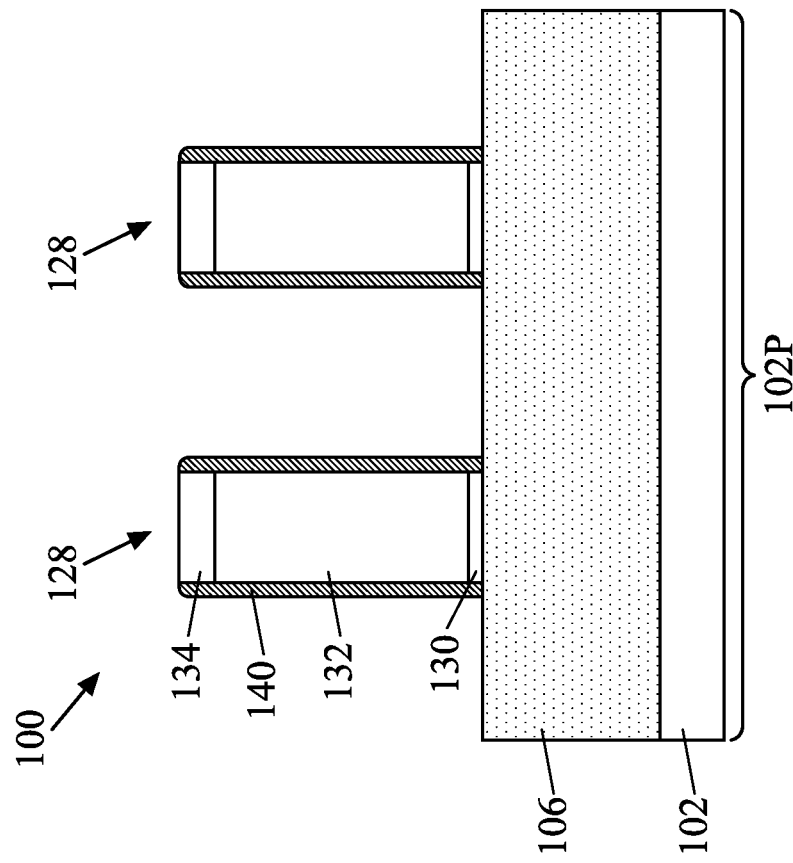

In FIGS. 5A-5B, a gate spacer 140 is formed on the sacrificial gate structures 128 and the exposed portions of the first and second semiconductor layers 104, 106. The gate spacer 140 may be conformally deposited on the exposed surfaces of the semiconductor device structure 100. The conformal gate spacer 140 may be formed by ALD or any suitable processes. An anisotropic etch is then performed on the gate spacer 140 using, for example, RIE. During the anisotropic etch process, most of the gate spacer 140 is removed from horizontal surfaces, such as tops of the sacrificial gate structures 128 and tops of the fins 108a-b, 110a-b, leaving the gate spacer 140 on the vertical surfaces, such as on opposite sidewalls of the sacrificial gate structures 128. The gate spacers 140 may partially remain on opposite sidewalls of the fins 108a-b, 110a-b, as shown in FIG. 5A. In some embodiments, the gate spacers 140 formed on the source/drain regions of the fins 108a-b, 110a-b are fully removed.

The gate spacer 140 may be made of a dielectric material such as silicon oxide ($SiO_2$), silicon nitride ($Si_3N_4$), silicon carbide (SiC), silicon oxynitride (SiON), silicon carbonitride (SiCN), silicon oxycarbide (SiOC), silicon oxycarbonitride (SiOCN), air gap, and/or any combinations thereof. In some embodiments, the gate spacer 140 include one or more layers of the dielectric material discussed herein.

In FIGS. 6A-6B, the first and second semiconductor layers 104, 106 of the fins 108a-b, 110a-b not covered by the sacrificial gate structures 128 and the gate spacers 140 are recessed, and source/drain (S/D) epitaxial features 152 are formed. For N-channel FETs, the epitaxial S/D features 152 may include one or more layers of Si, SiP, SiC, SiCP, or a group III-V material (InP, GaAs, AlAs, InAs, InAlAs, InGaAs). In some embodiments, the epitaxial S/D features 152 may be doped with N-type dopants, such as phosphorus (P), arsenic (As), etc, for N-type devices. For P-channel FETs, the epitaxial S/D features 152 may include one or more layers of Si, SiGe, SiGeB, Ge, or a group III-V material (InSb, GaSb, InGaSb). In some embodiments, the epitaxial S/D features 152 may be doped with P-type dopants, such as boron (B). The epitaxial S/D features 152 may grow both vertically and horizontally to form facets, which may correspond to crystalline planes of the material used for the substrate 102. The epitaxial S/D features 152 may be formed by an epitaxial growth method using CVD, ALD or MBE.

In some embodiments, the portions of the first semiconductor layer 104 on both sides of each sacrificial gate structure 128 are completely removed, and the S/D epitaxial features 152 are formed on the P-well region 103P of the fins 108a-b. The S/D epitaxial features 152 may grow both vertically and horizontally to form facets, which may correspond to crystalline planes of the material used for the substrate 102. In some embodiments, the S/D epitaxial features 152 of the fins 108a-108b and 110a-110b are merged, as shown in FIG. 6A. The S/D epitaxial features 152 may each have a top surface at a level higher than a top surface of the first semiconductor layer 104, as shown in FIG. 6B.

Figure 7A:
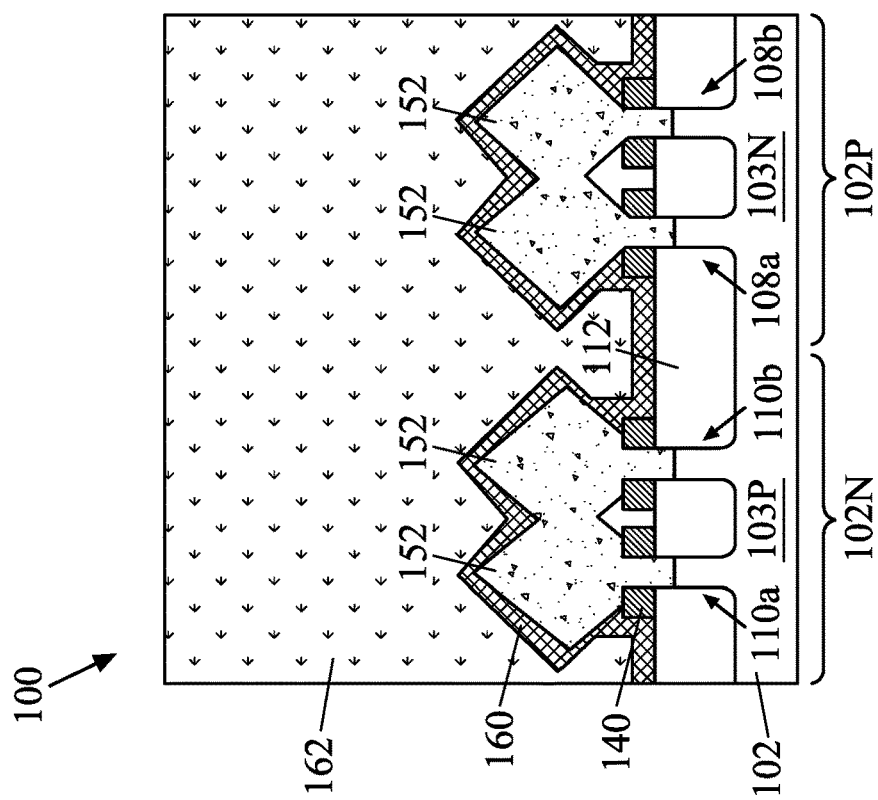
Figure 7B:
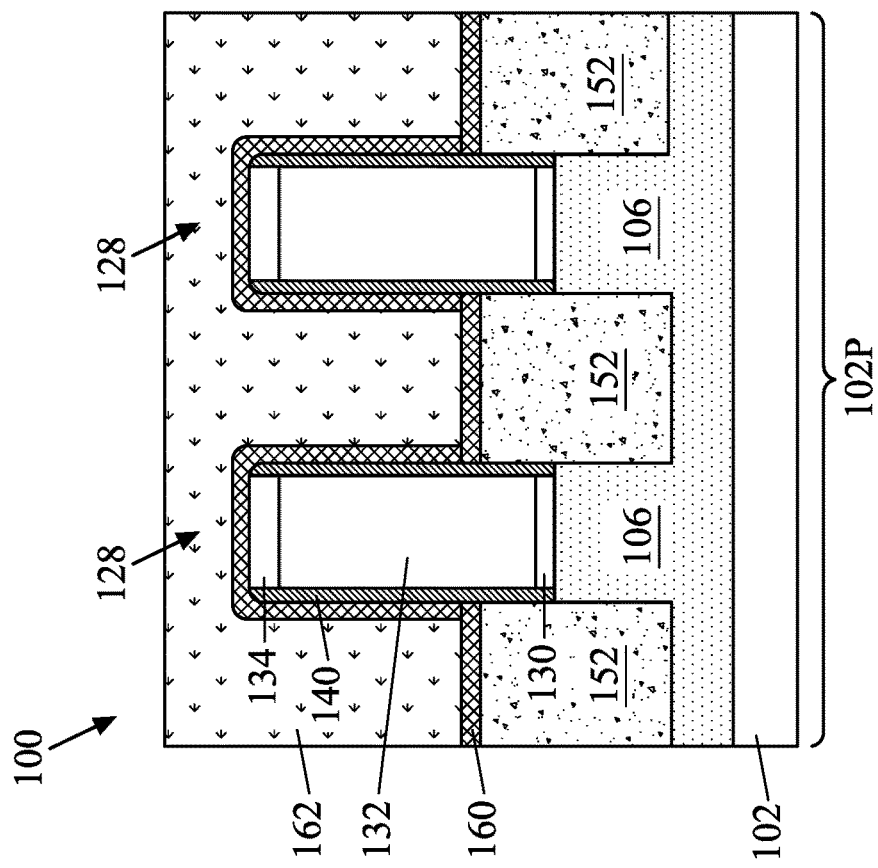

In FIGS. 7A-7B, a contact etch stop layer (CESL) 160 is conformally formed on the exposed surfaces of the semiconductor device structure 100. The CESL 160 covers the sidewalls of the sacrificial gate structures 128, the insulating material 112, and the S/D epitaxial features 152. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) 162 is formed on the CESL 160. The materials for the first ILD 162 may include compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD 162 may be deposited by a PECVD process or FCVD process or other suitable deposition technique. In some embodiments, after formation of the first ILD 162, the semiconductor device structure 100 may be subject to a thermal process to anneal the first ILD 162. After formation of the first ILD 162, a planarization process is performed to expose the sacrificial gate electrode layer 132. The planarization process may be any suitable process, such as a CMP process. The planarization process removes portions of the first ILD 162 and the CESL 160 disposed on the sacrificial gate structures 128. The planarization process may also remove the mask structure 134.

Figures 8A, 8B:
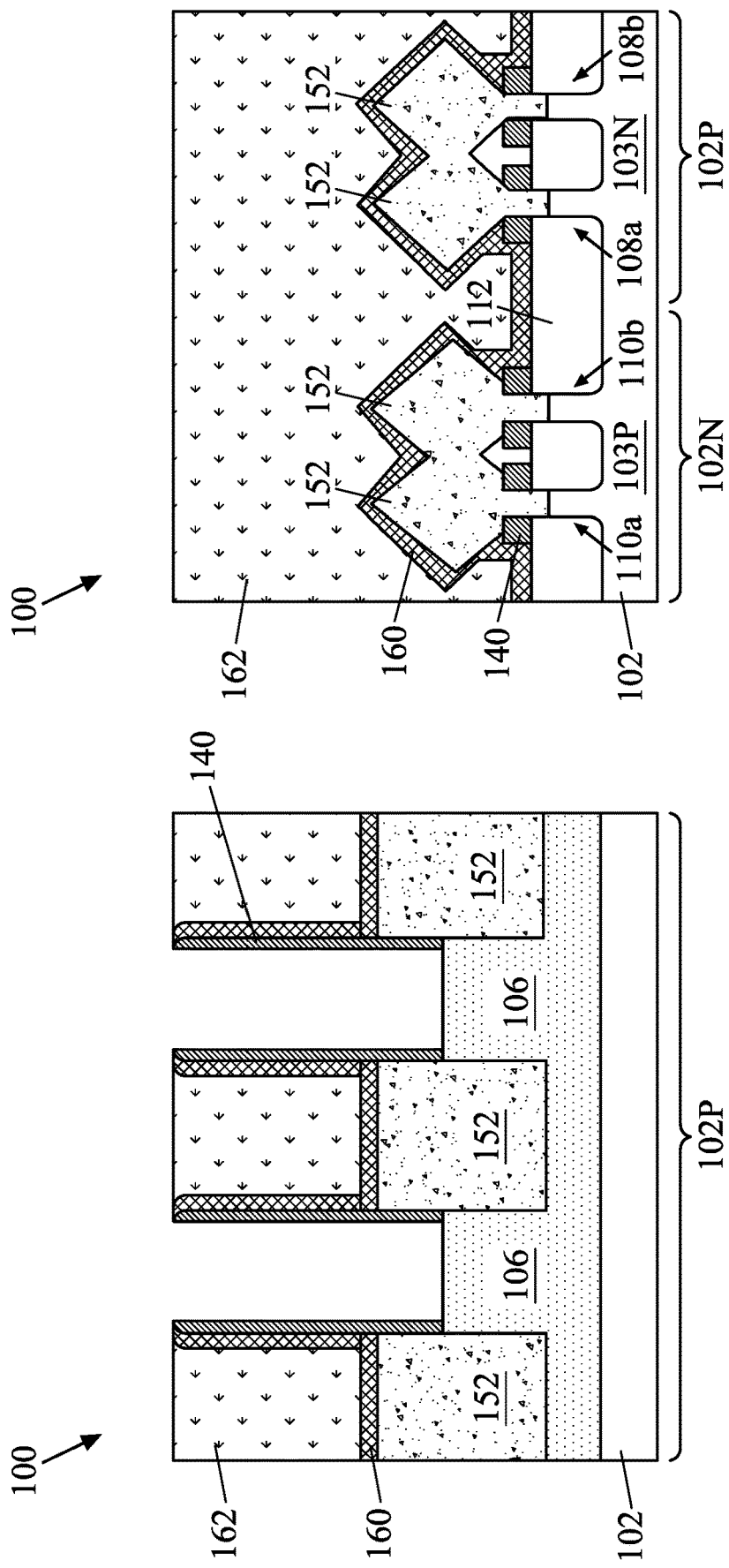

In FIGS. 8A-8B, the mask structure 134 (if not removed during CMP process), the sacrificial gate electrode layers 132 (FIG. 7B), and the sacrificial gate dielectric layers 130 (FIG. 7B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the gate spacer 140, the CESL 160, and the first ILD 162. The removal of the sacrificial gate electrode layers 132 and the sacrificial gate dielectric layers 130 exposes a top portion of the first and second semiconductor layers 104, 106 (only first semiconductor layers 104 can be seen in FIG. 8A) in the channel region.

Figures 9A, 9B:
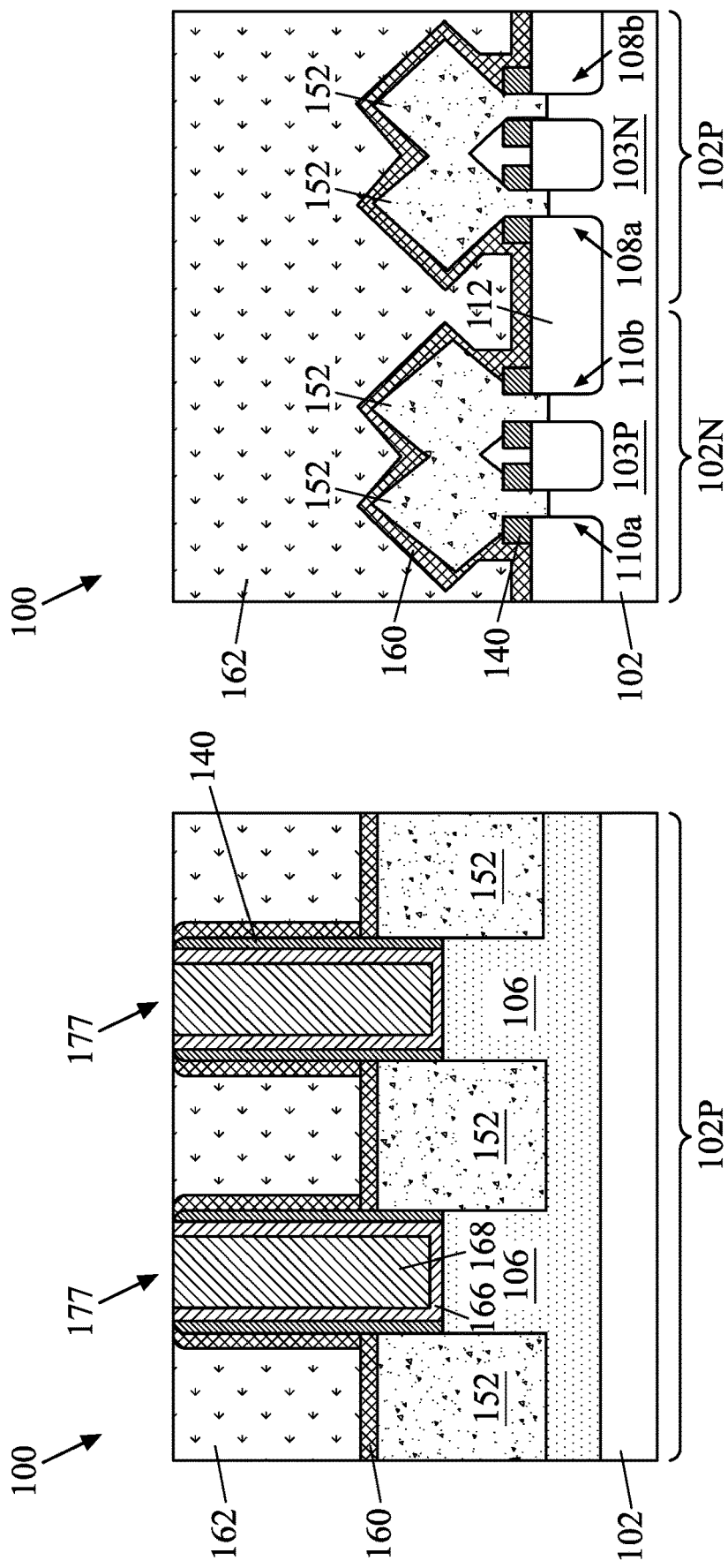

In FIGS. 9A-9B, replacement gate structures 177 are formed. The replacement gate structure 177 may include a gate dielectric layer 166 and a gate electrode layer 168 formed on the gate dielectric layer 166. The gate dielectric layer 166 may include one or more dielectric layers and may include the same material(s) as the sacrificial gate dielectric layer 130. In some embodiments, the gate dielectric layer 166 is a high-K dielectric material such as metal oxides, metal nitrides, metal silicates, transition metal-oxides, transition metal-nitrides, transition metal-silicates, oxynitrides of metals, metal aluminates, zirconium silicate, zirconium aluminate, or any combination thereof. For example, the gate dielectric layer 166 may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$), barium titanium oxide (BaTiO$_3$), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), silicon nitride (Si$_3$N$_4$), oxynitrides (SiON), and combinations thereof. In alternative embodiments, the gate dielectric layer 166 may have a multilayer structure such as one layer of silicon oxide (e.g., interfacial layer) and another layer of high-K material. In some embodiments, the gate dielectric layer 166 may be deposited by one or more ALD processes or other suitable processes.

Depending on the application and/or conductivity type of the devices in the N-type region 102N and the P-type region 102P, the gate electrode layer 168 may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or any combinations thereof. For devices in the N-type region 102N, the gate electrode layer 168 may be AlTiO, AlTiC, or a combination thereof. For devices in the P-type region 102P, the gate electrode layer 168 may be AlTiO, AlTiC, AlTiN, or a combination thereof. The gate electrode layers 168 may be formed by PVD, CVD, ALD, electro-plating, or other suitable method.

Figure 10A:
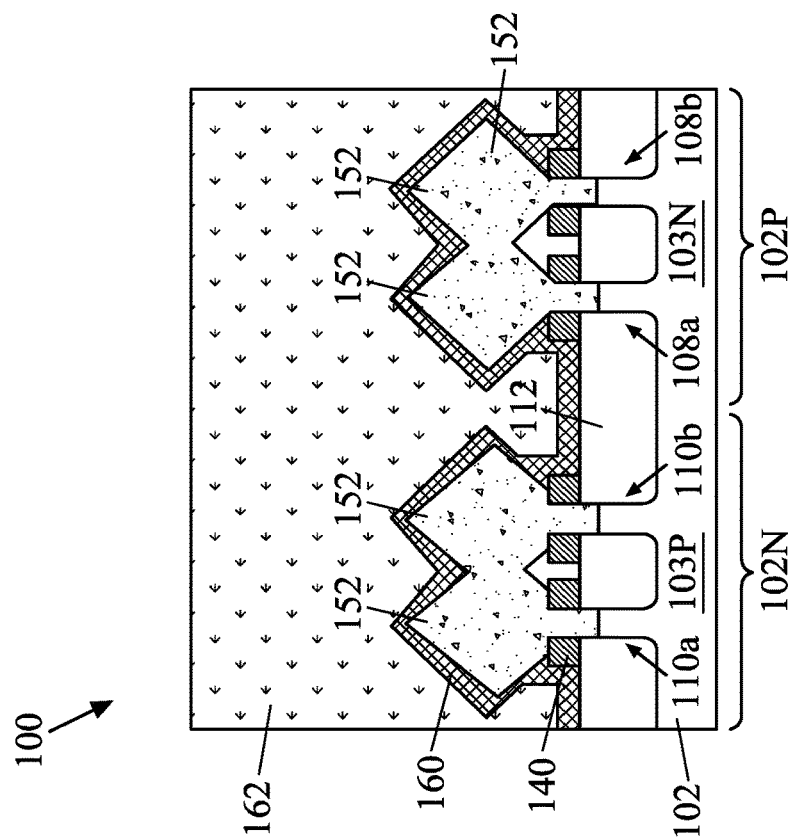
Figure 10B:
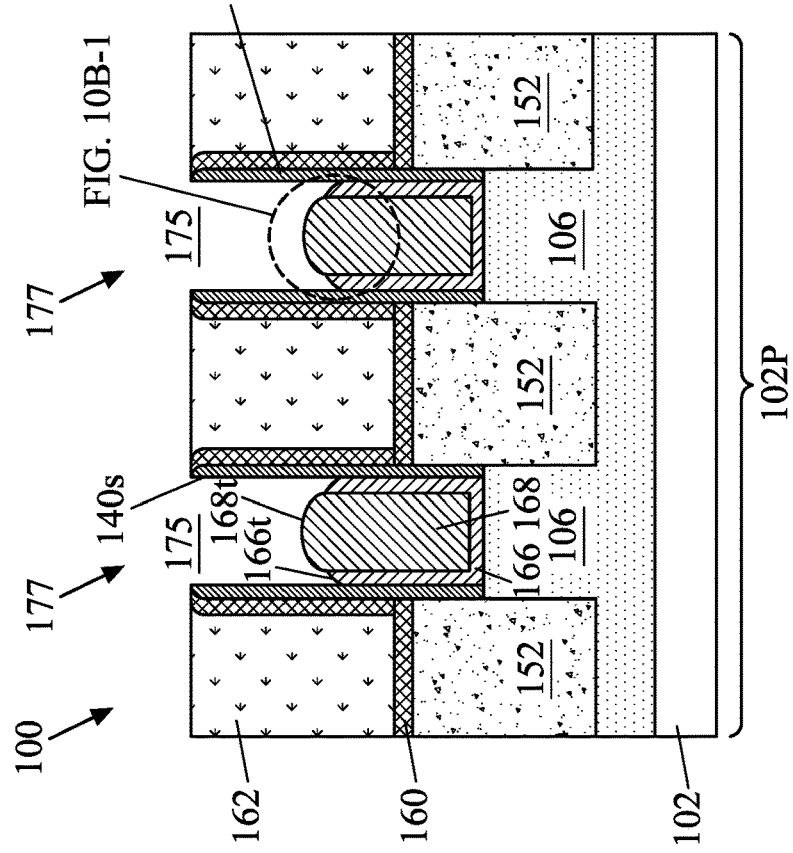
Figures 2, 10B:
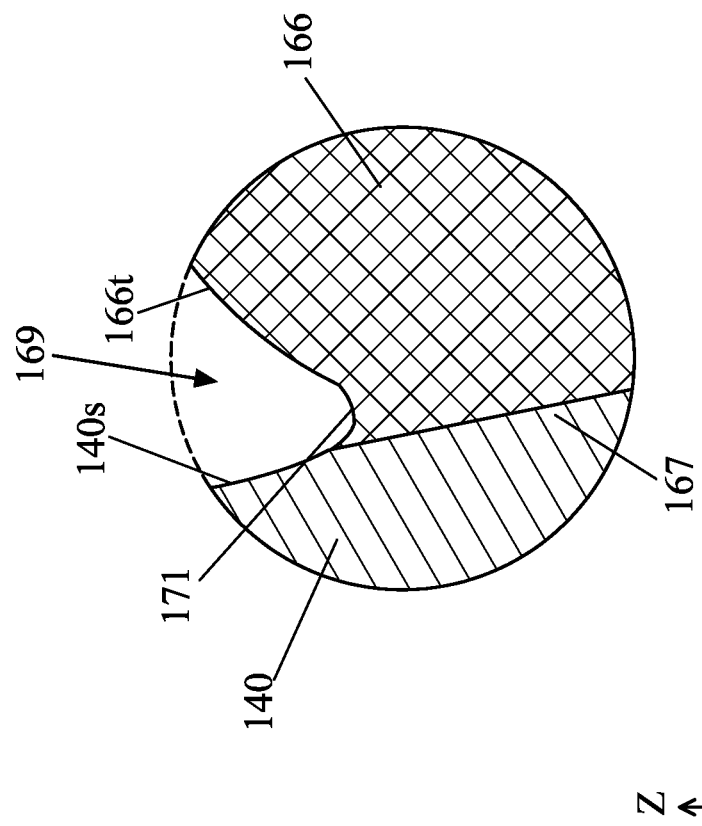
Figures 1, 10B:
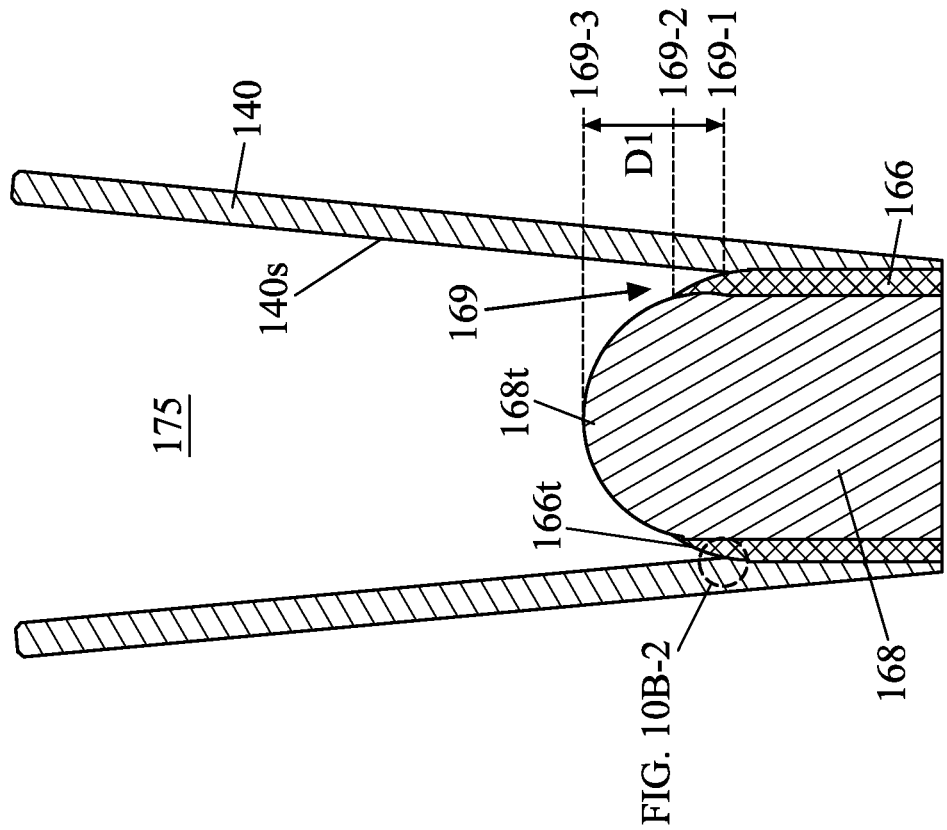

In FIGS. 10A-10B, a metal gate etching back (MGEB) process is performed to remove portions of the gate dielectric layer 166 and the gate electrode layer 168. Recesses 175 are formed in the region between neighboring gate spacers 140 as a result of the removal of the portions of the gate dielectric layer 166 and the gate electrode layer 168. The recesses 175 are defined by the exposed sidewalls 140s of the gate spacers 140 and the recessed top surfaces 166t and 168t of the gate electrode layers 168 and the gate dielectric layers 166, respectively. The recesses 175 allow for subsequent first dielectric cap layer 173 (FIG. 11B) to be formed therein and protect the replacement gate structures 177. The MGEB process may include one or more etching processes, which may be dry etching, wet etching, atomic layer etching (ALE), plasma etching, any suitable etching back, or a combination thereof. The one or more etching processes performed in the MGEB process are selective to materials of the replacement gate structures 177 with respect to the gate spacers 140 and the first ILD 162 so that the top surfaces 166t and 168t of the gate electrode layers 168 and the gate dielectric layers 166, respectively, are at a level lower than top surfaces of the gate spacers 140 and the first ILD 162.

In some embodiments, the one or more etching processes are controlled so that etch rates of the gate dielectric layers 166 and the gate electrode layer 168 at and/or near exposed sidewalls 140s of the gate spacers 140 are faster than the etch rates of the gate dielectric layers 166 and the gate electrode layer 168 at and/or near the center of the top surface 168t of the gate electrode layer 168. As a result, the top surface 168t of the gate electrode layer 168 may have a curved surface with a convex profile. FIG. 10B-1 is an enlarged view of a portion of the semiconductor device structure 100 showing the recess 175 in accordance with some embodiments. As can be seen, the bottom of the recess 175, which is defined by the top surfaces 166t and 168t of the gate electrode layers 168 and the gate dielectric layers 166, respectively, has a concave profile (i.e., rounded inward). The top surface 168t of the gate electrode layer 168 is curved or rounded outward so that the edges of the top surface 168t are at an elevation lower than that of the center of the top surface 168t. Particularly, the exposed sidewalls 140s of the gate spacers 140 and the recessed top surfaces 166t and 168t of the gate electrode layers 168 and the gate dielectric layers 166 define a micro-trench 169 therebetween. The micro-trenches 169 are to be filled with a first dielectric cap layer 141 (FIG. 11B). In some embodiments, the bottom of the micro-trench 169, e.g., the point where the gate spacer 140 and the gate dielectric layer 166 meets (or the lowest point of exposed gate dielectric layer 166), is at a first elevation 169-1, the highest point of the top surface 166t of the exposed gate dielectric layer 166 is at a second elevation 169-2 that is higher than the first elevation 169-1, and the highest point of the top surface 168t of the exposed gate electrode layer 168 is at a third elevation 169-3 that is higher than the second elevation 169-2. In some embodiments, the distance D1 between the first elevation 169-1 and the third elevation 169-3 may be in a range between about 1 nm and about 15 nm, such as about 2 nm to 6 nm.

Figures 15A, 15B:
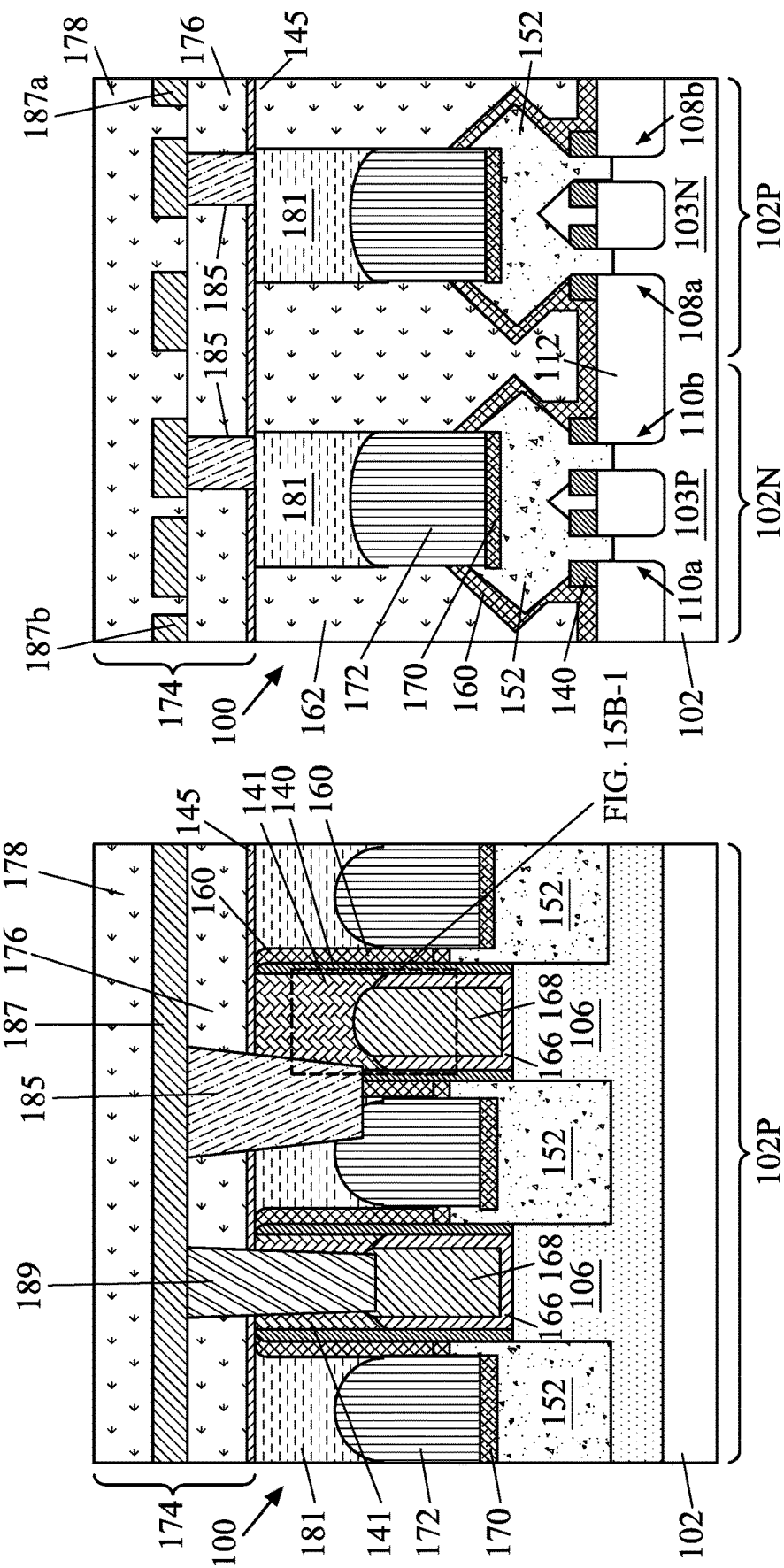

In most embodiments, contact vias of the source/drain contact (e.g., vertical interconnect features 185 disposed in an interconnect structure 174 as shown in FIG. 15B) are aligned with the respective source/drain contact, such as the conductive feature 172 (FIG. 15B) disposed between two adjacent replacement gate structures. In some embodiments, however, some contact vias of the source/drain contact may be slightly misaligned with the corresponding conductive feature 172. In conventional replacement gate structures where gate electrode layers may have a concave profile (such as dishing), the misalignment of the contact vias of the source/drain contact may result in partial overlap with a portion of the gate electrode layer 168 having a concave profile. As a result, the contact vias of the source/drain contact and the gate electrode layer are connected, and thus current leakage and degraded performance of the device. With the micro-trench 169 of the recess 175 and the convex surface profile of the gate electrode layer 168, the subsequent contact vias (e.g., vertical interconnect features 185, FIG. 15B) of the source/drain contacts are less likely to connect with the gate electrode layer 168 when misalignment occurs, as one exemplary example shown in FIG. 15B. In addition, the convex top surface of the gate electrode layer 168 shortens the distance to subsequent metal gate contact vias (e.g., vertical interconnect features 189 in FIG. 15B), allowing easier landing of the metal gate contact vias on the gate electrode layer 168 as compared to gate electrode layers with a concave top surface profile. Therefore, if the distance D1 is less than about 1 nm, the convexity of the top surface 168t is diminished and the edge portion top surface 168t of the gate electrode layer 168 may connect with the contact vias of the source/drain contact when misalignment occurs. On the other hand, if the distance D1 is greater than 15 nm, the manufacturing cost is increased without significant advantage.

The one or more etching processes used during the MGEB process may be controlled such that etching phenomenon at or near an interface between the gate spacer 140 and the gate dielectric layer 166 is dominant over the etching phenomenon at or near the top surface 168t of the gate electrode layer 168. In some embodiments, the one or more etching processes are performed so that the bottom of the micro-trench 169 is formed with a smooth rounded surface profile. FIG. 10B-2 is an enlarged view of a portion of the gate spacers 140 and the gate dielectric layer 166 showing the micro-trench 169 in accordance with some embodiments. As can be seen, the micro-trench 169 is formed by removing portions of the gate dielectric layer 166 and the gate spacer 140. The surface profile of the micro-trench 169 may be defined by the sidewall 140s of the gate spacer 140, the top surface 166t of the gate dielectric layer 166, and a corner surface 171 of the gate dielectric layer 166 located between the sidewall 140s and the top surface 166t and immediately adjacent the interface 167 defined by the gate spacer 140 and the gate dielectric layer 166. In some embodiments, the top surface 166t may have a first curvature and the corner surface 171 may have a second curvature greater than the first curvature. Without being bounded by any particular theory, such surface profile of the micro-trench 169 is ascribed to ion bombardment during the etch processes and ion reflection from the sidewalls 140s and top surface 166t on incidence, followed by re-impingement of the ions onto the corner surface 171 to achieve the curvature as shown. Such surface profile can also be achieved through the process conditions of the etch processes, such as lower chamber pressure and/or increased RF bias power, as will be discussed in more detail below.

In various embodiments, the MGEB process is a plasma etching process using one or more etchants, such as a chlorine-containing gas, an oxygen-containing gas, and/or a fluorine-containing gas. An inert gas, such as argon (Ar), may be provided with the etchants to increase bombardment effect and thus, enhanced etch rates of the gate dielectric layer 166 and the gate electrode layer 168. The plasma may be formed by a capacitively coupled plasma (CCP) source or an inductively coupled plasma (ICP) source driven by an RF power generator or a microwave plasma source. In cases where ICP source is used, the plasma etching process may be performed in a process chamber having a side wall, a ceiling, a heater, and a plasma source power applicator comprising a coil antenna disposed over the ceiling and/or around the side wall. The plasma source power applicator is coupled through an impedance match network to an RF power source, which may use a continuous wave RF power generator or a pulsed RF power generator operating on a predetermined duty cycle. Electric field may be used during the MGEB process to control behavior of the plasmas, and thus the profile of the micro-trench 169. For example, an increased RF bias power (supplied to the heater upon which the semiconductor device structure is disposed) and/or increased ion acceleration energy may be employed to enhance micro-trenching phenomenon at or near the interface 167 between the gate spacer 140 and the gate dielectric layer 166.

In some embodiments, the one or more plasma etching processes used during the MGEB process are performed by the ICP source or microwave source driven by the RF power generator using a tunable frequency ranging from about 2 MHz to about 13.56 MHz or 2.45 GHz, and the chamber is operated at a pressure in a range of about 3 mTorr to about 150 mTorr (e.g., 2 mTorr to about 10 mTorr) in ICP etcher or 0.3 mTorr to about 50 mTorr (e.g., 1 mTorr to about 10 mTorr) in microwave plasma etcher and a temperature of about −80 degrees Celsius to about 140 degrees Celsius (e.g., about 20 degrees Celsius to about 50 degrees Celsius). The RF power generator is operated to provide source power between about 500 watts to about 2000 watts (e.g., about 800 W to about 1000 W), and the output of the RF power generator is controlled by an optional pulse signal having a duty cycle in a range of about 10% to about 90%. An RF biasing power to the heater is in a range of about 30 W to about 1000 W (e.g., about 50 W to about 500 W). The source power and the RF biasing power may be controlled so that the ion acceleration energy is between about 30 eV to about 1000 eV (e.g., 50 eV to about 500 eV). In some embodiments, the plasma is formed from a gas mixture comprising a chlorine-containing gas and an oxygen-containing gas. In some embodiments, the plasma is formed from a gas mixture comprising a fluorine-containing gas, a chlorine-containing gas, an oxygen-containing gas, and argon. In some embodiments, the plasma is formed from a gas mixture comprising a fluorine-containing gas, an oxygen-containing gas, and argon. Exemplary chlorine-containing gas may include, but are not limited to, $Cl_2$, $CHCl_3$, $CCl_4$, $BCl_3$, or a combination thereof. Exemplary oxygen-containing gas may include, but are not limited to, $O_2$, $O_3$, or a combination thereof. Exemplary fluorine-containing gas may include, but are not limited to, $CF_4$, $SF_6$, $CH_3F$, $CH_2F_2$, $CHF_3$, $C_4F_6$, $C_4F_8$, or a combination thereof. In cases where the gas mixture comprises a chlorine-containing gas (e.g., $Cl_2$), an oxygen-containing gas (e.g., $O_2$), and argon, the chlorine-containing gas, the oxygen-containing gas, and argon may be introduced into the process chamber at a ratio ($Cl_2$:$O_2$:Ar) of about 10:1:5 to about 50:1:5, for example about 20:1:5.

In some embodiments, which can be combined with one or more embodiments of the present disclosure, the plasma etching process is a cyclic process including repetitions of a first plasma etching step and a second plasma etching step. The first plasma etching step may be the typical plasma etching process that used to remove the gate electrode layer 168, and the second plasma etching step may be the plasma etching process discussed above and used to remove more of gate electrode layer 168 that is at a position nearing the interface of gate spacer 140 and the gate dielectric layer 166, or vice versa. The cyclic process may use alternating chlorine/oxygen/fluorine-based plasma and chlorine/oxygen/fluorine-based plus argon plasma. For example, the first plasma etching step may use a fluorine/chlorine and oxygen-based plasma and the second plasma etching step may use a fluorine/chlorine and oxygen-based plasma plus argon plasma, or vice versa. The use of a cyclic etching process combining the advantageous of two-step etching or cyclic-etching processes is effective in improving micro-trenching phenomenon (e.g., micro-trench 169) at or near the interface 167 between the gate spacer 140 and the gate dielectric layer 166.

In some embodiments, which can be combined with one or more embodiments of the present disclosure, an ion implantation process may be performed after the one or more plasma etching processes to promote etch reaction at or near the interface 167 between the gate spacer 140 and the gate dielectric layer 166. The ion implantation process is performed so that majority of the ion species are implanted into the replacement gate structures 177 and change material properties of the replacement gate structures 177 (e.g., gate dielectric layer 166 and gate electrode layer 168). For example, the ion species may be employed to increase etch rate of the implanted regions by transforming the implanted region into an amorphous state.

The ion implantation process may employ one or more ion species selected from an inert gas, such as Ne, Ar, Kr, or Xe. In one embodiment, the Ar ion species are used. The ion implantation process may be a tilted, rotational implantation process where the ion species are implanted with a tilt angle of about 5 degrees to about 30 degrees. The tilt angle herein is defined as an angle between the sidewall 140s of the gate spacer 140 and the incident ion beam direction. Due to the height of the gate spacer 140, the implant with tilted angle and rotated operation allows the ion species to be implanted at the regions near the interface between the gate spacer 140 and the gate dielectric layer 166, thereby promoting the micro-trenching phenomenon at or near the interface 167 between the gate spacer 140 and the gate dielectric layer 166. The ion implantation process may be performed at a low-temperature range (e.g., 25 degrees Celsius to about 150 degrees Celsius). The implant dosage and ion kinetic energy of the ion species may be selected to achieve desired implant concentration profile in the target regions. In some embodiments, the ion species are implanted at a kinetic energy in a range of about 1 KeV to about 30 KeV, and an implant dosage of each group of ion species may be in a range of about $1E10^{12}$ atoms/cm$^2$ to about $3E10^{22}$ atoms/cm$^2$.

In some embodiments, the one or more etching processes used during the MGEB process are performed so that the bottom of the recess 175, which is defined by the top surfaces 166t and 168t of the gate electrode layers 168 and the gate dielectric layers 166, respectively, has a flat surface. In some embodiments, the one or more etching processes are performed so that the top surfaces 166t and 168t are formed flat after the MGEB process, and the top surface 168t of the gate electrode layer 168 is higher than the top surface 166t of the gate dielectric layer 166. FIG. 10B-3 illustrates an alternative embodiment in which the gate electrode layers 168 and the gate dielectric layers 166 are etched to have a flat surface after the MGEB process. Particularly, the top surface 168t of the gate electrode layer 168 is at an elevation 169-4 and the top surface 166t of the gate dielectric layer is at an elevation 169-5 that is lower than the elevation 169-4. In some embodiments, the distance D2 between the elevation 169-4 and the elevation 169-5 may be in a range between about 1 nm and about 5 nm.

In some embodiments, which can be combined with one or more embodiments of the present disclosure, a micro-trench, such as the micro-trench 169 of FIG. 10B-2, may also be formed at a corner region 149 adjacent an interface between the gate spacer 140 and the gate dielectric layer 166.

In some embodiments, which can be combined with one or more embodiments of the present disclosure, the gate electrode layers 168 with a convex top surface are formed by a multi-step process. For example, a first etching process (e.g., the plasma etching process discussed above) may be performed so that the top surfaces of the gate dielectric layer and the gate electrode layer are lower than a top surface of the first ILD 162. Next, an ion implantation process (e.g., the tilted implantation process as discussed above) may be performed so that the material properties of the top surfaces of the gate dielectric layer and the gate electrode layer are modified. Additionally or alternatively, a second etching process (e.g., the plasma etching process discussed above) may be performed to promote the micro-trenching phenomenon (e.g., formation of the micro-trench 169) at or near the interface 167 between the gate spacer 140 and the gate dielectric layer 166.

Figure 11A:
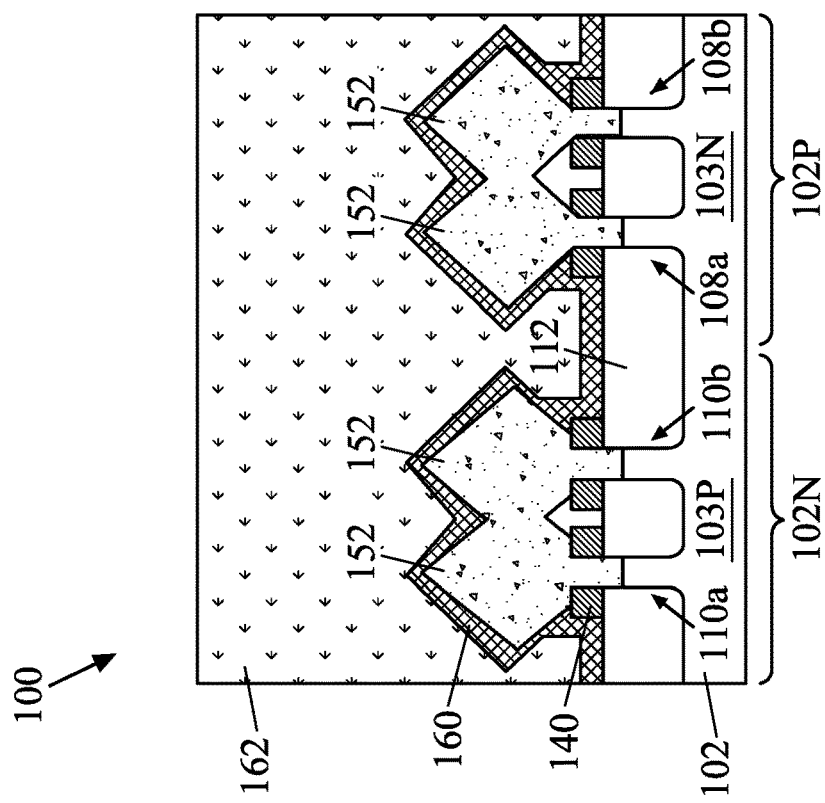
Figure 11B:
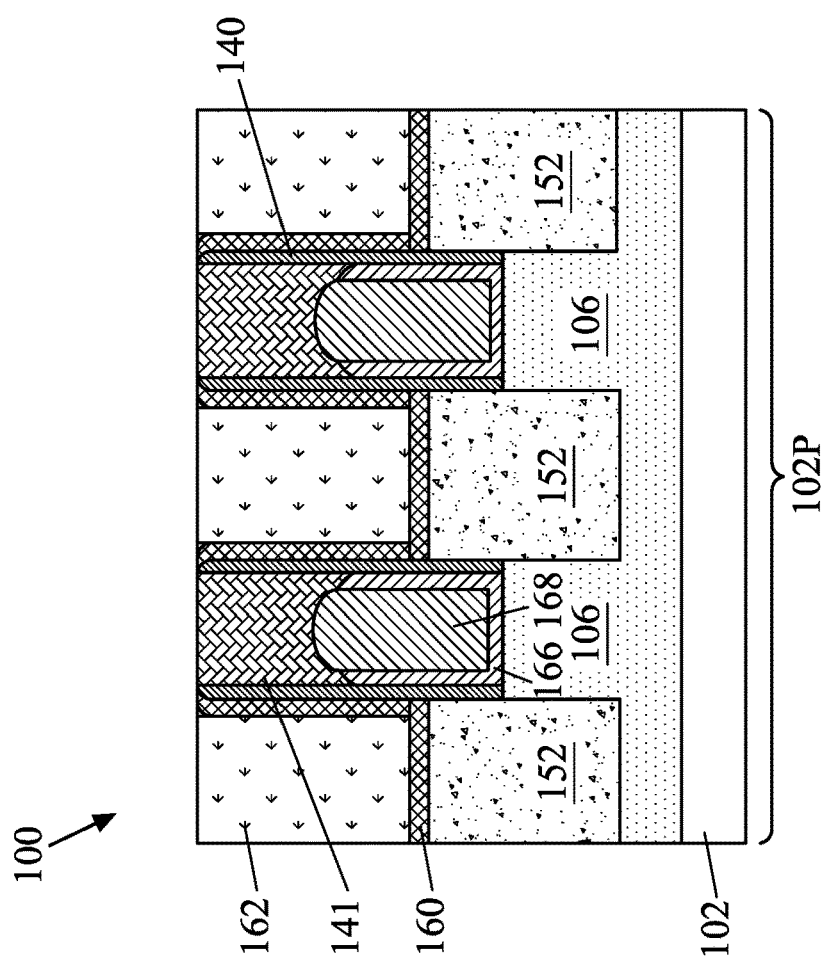

In FIGS. 11A-11B, a first dielectric cap layer 141 is formed in the trenches 175, over the replacement gate structures 177. The first dielectric cap layer 141 fills in the trenches 175 and over the first ILD 162 to a pre-determined height using a deposition process, such as CVD, PECVD, or FCVD or any suitable deposition technique. A CMP process is then performed to remove excess deposition of the first dielectric cap layer 141 outside the trenches 175 until the top surface of the first ILD 162 is exposed. The first dielectric cap layer 141 defines self-aligned contact (SAC) regions and thus may serve as an etch stop layer during subsequent trench and via patterning for metal contacts. The first dielectric cap layer 141 can be formed of any dielectric material that has different etch selectivity than the gate spacers 140, the CESL 160, and the first ILD 162. In some embodiments, the first dielectric cap layer 141 may include or be formed of an oxygen-containing material, a nitrogen-containing material, or a silicon-containing material. Exemplary materials for the first dielectric cap layer 141 may include, but are not limited to, SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof.

Figure 12A:
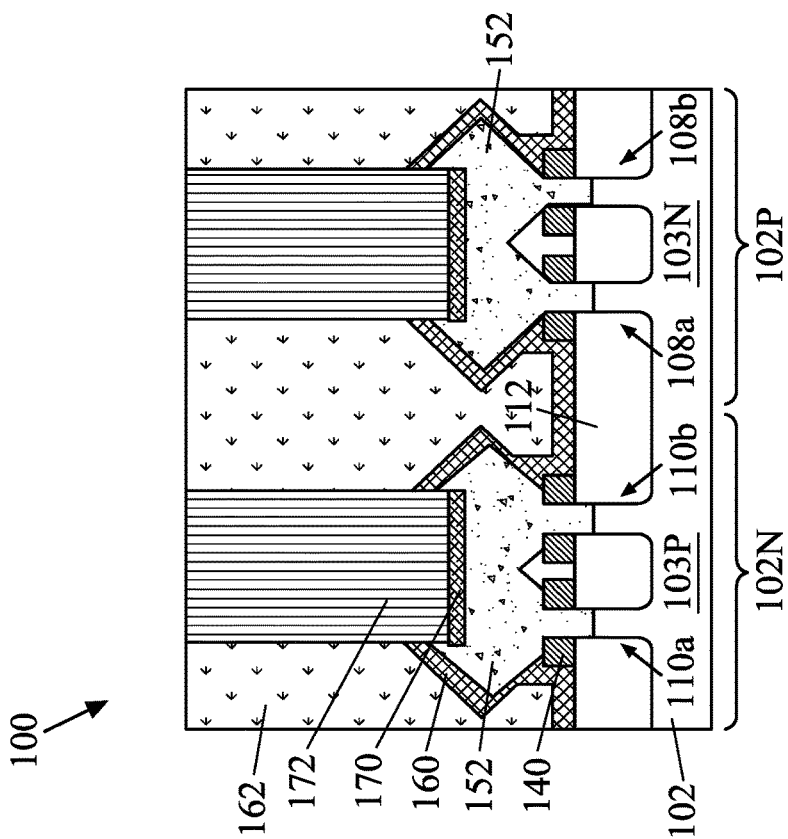
Figure 12B:
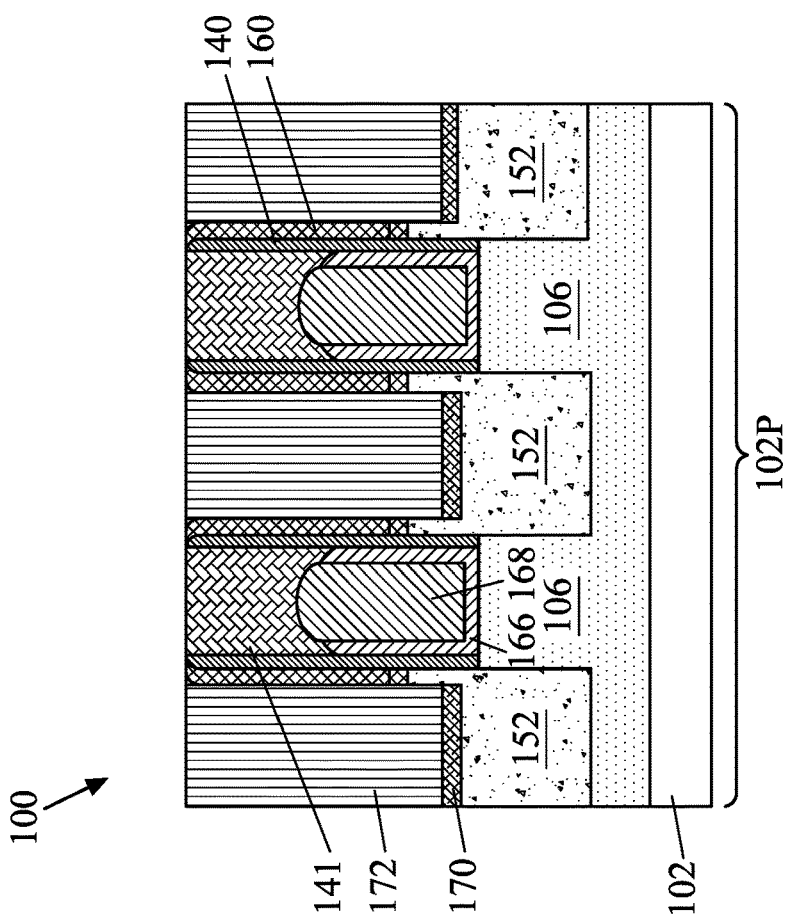

In FIGS. 12A-12B, portions of the first ILD 162 and the CESL 160 disposed on both sides of the replacement gate structures 177 are removed. The removal of the portions of the first ILD 162 and the CESL 160 forms a contact opening exposing the S/D epitaxial features 152. In some embodiments, the upper portion of the exposed S/D epitaxial features 152 is removed. A conductive feature 172 (i.e., S/D contacts) is then formed in the contact openings over the S/D epitaxial features 152. The conductive feature 172 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electrochemical plating, or other suitable method. A silicide layer 170 may be formed between the S/D epitaxial feature 152 and the conductive feature 172. The silicide layer 170 conductively couples the S/D epitaxial features 152 to the conductive feature 172. The silicide layer 170 is a metal or metal alloy silicide, and the metal may include a noble metal, a refractory metal, a rare earth metal, alloys thereof, or combinations thereof. Once the conductive features 172 are formed, a planarization process, such as CMP, is performed on the semiconductor device structure 100 until the top surface of the first dielectric cap layer 141 is exposed.

Figure 13A:
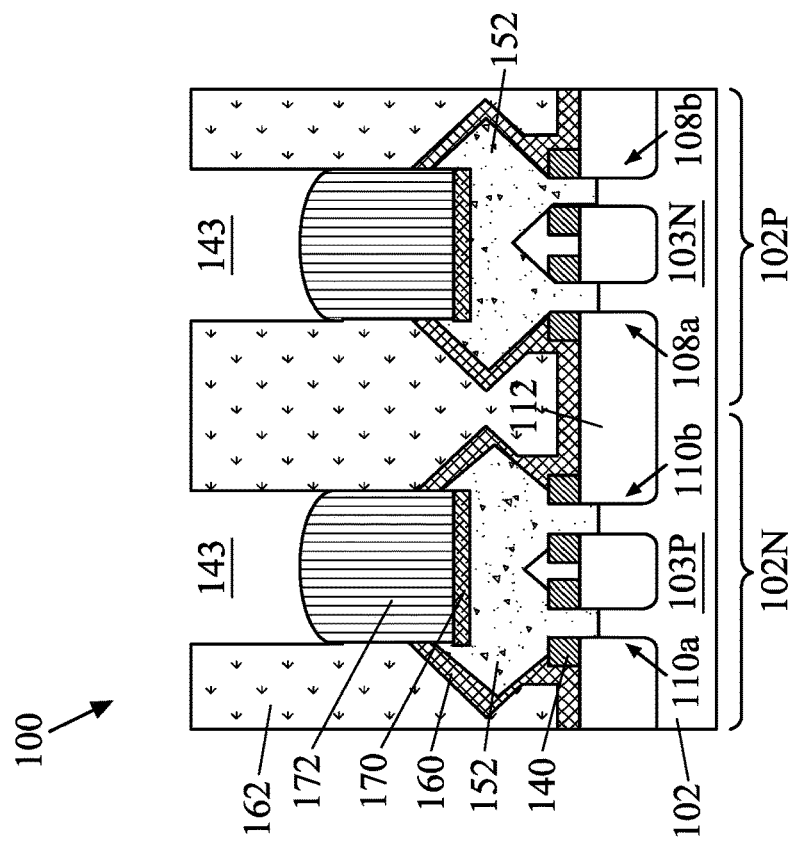
Figure 13B:
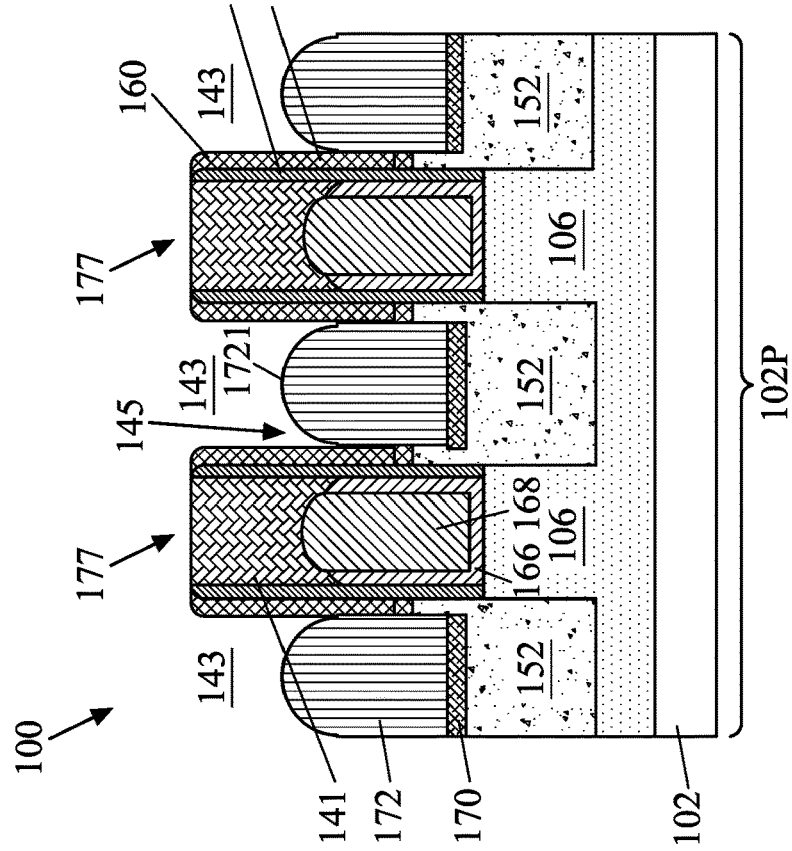

In FIGS. 13A-13B, after the conductive features 172 are formed, portions of the conductive feature 172 are removed. Recesses 143 are formed in the region between replacement gate structures 177 as a result of the removal of the portions of the conductive feature 172. The removal of the portions of the conductive feature 172 may be performed by the same etching process used to remove the gate electrode layers 168 as discussed above. Upon completion of the etching process, the bottom of the recesses 143, which is defined by a top surface 172t of the conductive features 172, may have a convex surface profile. In some embodiments, the etching process is performed so that a micro-trench 145 is formed at or near interfaces between the conductive feature 172 and the CESL 160. The micro-trench 145 may have similar surface profile as the micro-trench 169 shown in FIGS. 10B-1 and 10B02. The micro-trenches 145 are to be filled with a second dielectric cap layer 181 (FIG. 14B). With the micro-trench 145 of the recess 143 and the convex surface profile of the conductive feature 172, the subsequent contact vias (e.g., vertical interconnect feature 189, FIG. 15B) of the metal gates are less likely to connect with the conductive feature 172 when misalignment occurs. In addition, the convex top surface of the conductive feature 172 shortens the distance to subsequent source/drain contact vias (e.g., vertical interconnect features 185 in FIG. 15B), allowing easier landing of the source/drain contact vias on the conductive feature 172 as compared to conductive features with a concave top surface profile.

Exemplary etching process for removing a portion of the conductive features 172 may utilize a CCP or ICP, or a microwave plasma source driven by an RF power generator using a tunable frequency ranging from about 2 MHz to about 2.45 GHz. The chamber may be operated at a pressure in a range of about 0.3 mTorr to about 150 mTorr and a temperature of about −80 degrees Celsius to about 140 degrees Celsius. The RF power generator is operated to provide source power between about 30 W to about 1000 W, and the output of the RF power generator controlled by an optional pulse signal having a duty cycle in a range of about 10% to about 90%. An RF biasing power to the heater is in a range of about 10 W to about 1000 W. The source power and the RF biasing power may be controlled so that the ion acceleration energy is between about 20 eV to about 200 eV (e.g., 50 eV to about 150 eV). Suitable gas mixture and process conditions for forming the plasma are identical or similar to those discussed above with respect to FIGS. 10A-10B-2.

Figure 14A:
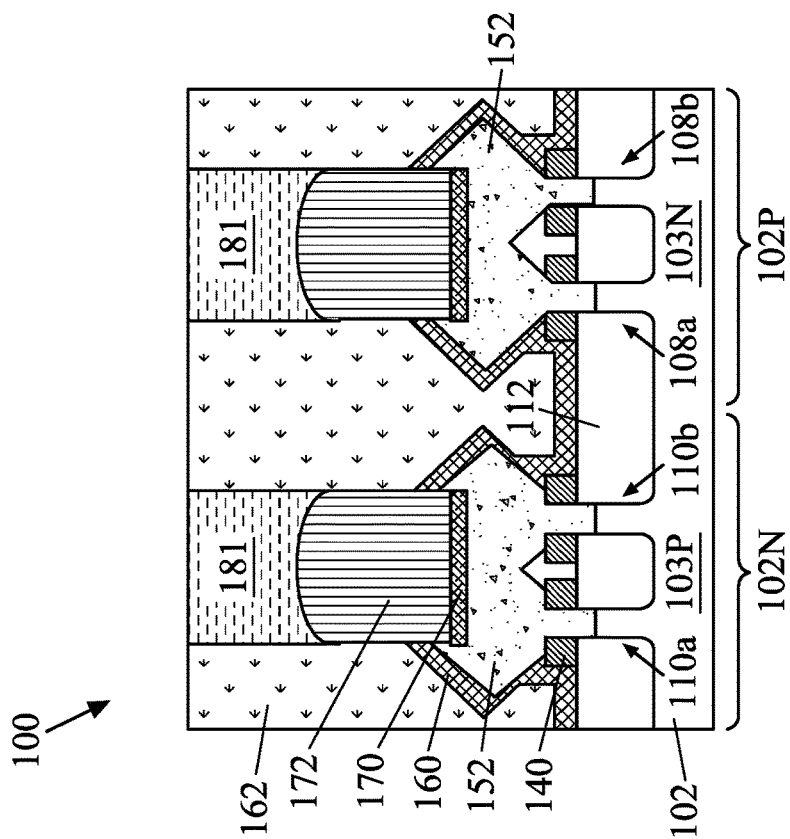
Figure 14B:
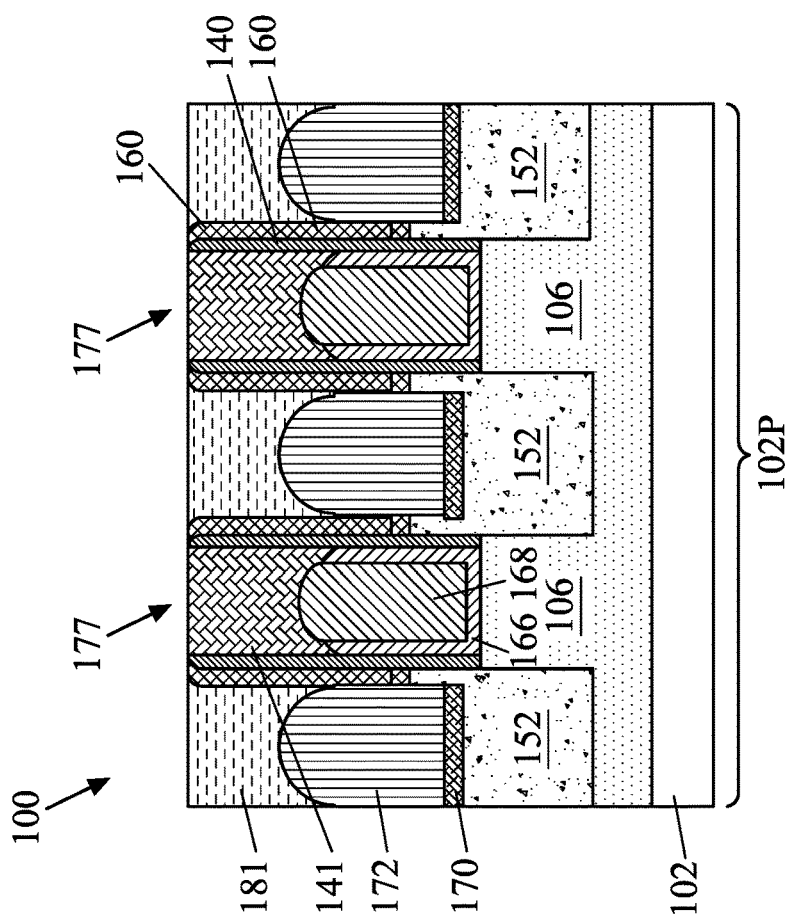

In FIGS. 14A-14B, a second dielectric cap layer 181 is formed in the recess 143 (FIGS. 13A, 13B) and over the first ILD 162 to a pre-determined height using a deposition process, such as CVD, PECVD, ALD, or any suitable deposition technique. A planarization process, such as CMP, is then performed to remove excess deposition of the second dielectric cap layer 181 and expose the top surface of the first ILD 162. The second dielectric cap layer 181 is chemically different than the first dielectric cap layer 141 and may be chosen from the material used for forming the first dielectric cap layer 141. For example, the first dielectric cap layer 141 may include SiN and the second dielectric cap layer 181 may include SiOC, SiOCN, or SiON. The second dielectric cap layer 181 can have different etch selectivity than the first dielectric cap layer 141, the gate spacers 140, the CESL 160, and the first ILD layer 162 so as to selectively etch back the second dielectric cap layer 181.

In FIGS. 15A-15B, an etch stop layer 145 and an interconnect structure 174 are formed over the semiconductor device structure 100. The etch stop layer 145 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof. The interconnect structure 174 may include one or more interlayer dielectrics and a plurality of interconnect features formed in each interlayer dielectric. In one exemplary embodiment, the interconnect structure 174 includes a second ILD 176 and a third ILD 178 formed over the second ILD 176, and a plurality of vertical interconnect features 185, 187, such as vias, and horizontal interconnect features 187, such as metal lines, embedded in the second and third ILDs 176, 178, respectively. The second ILD 176 and the third ILD 178 may include the same material as the first ILD 162. The vertical interconnect features 185 are selectively formed to provide electrical connection to some of the S/D contacts (e.g., conductive feature 172). The vertical interconnect features 189 are selectively formed through the second ILD 176 and the first dielectric cap layer 141 to electrically connect the gate electrode layer (e.g., gate electrode layer 168) to the horizontal interconnect features 187. The horizontal interconnect features 187 are formed to selectively provide electrical connection between the S/D contacts in the N-type region 102N and the P-type region 102P. The vertical interconnect features 185, 189 and the horizontal interconnect features 187 may include or be formed of W, Ru, Co, Cu, Ti, TiN, Ta, TaN, Mo, Ni, or combinations thereof.

A power rail (not shown) may be formed in the third ILD layer 178 and configured to be in electrical connection with the S/D epitaxial features 152 through the S/D contacts (e.g., conductive feature 172), the vertical interconnect feature 185, and the horizontal interconnect features 187. Depending on the application and/or conductivity type of the devices in the N-type region 102N and the P-type region 102P, the power rail may be fed with a positive voltage (VDD) or a negative voltage (VSS) (i.e., ground or zero voltage). For example, the VDD may be provided to the horizontal interconnect features 187a and the VSS may be provided to the horizontal interconnect features 187b, as shown in FIG. 15A.

Figure 18A:
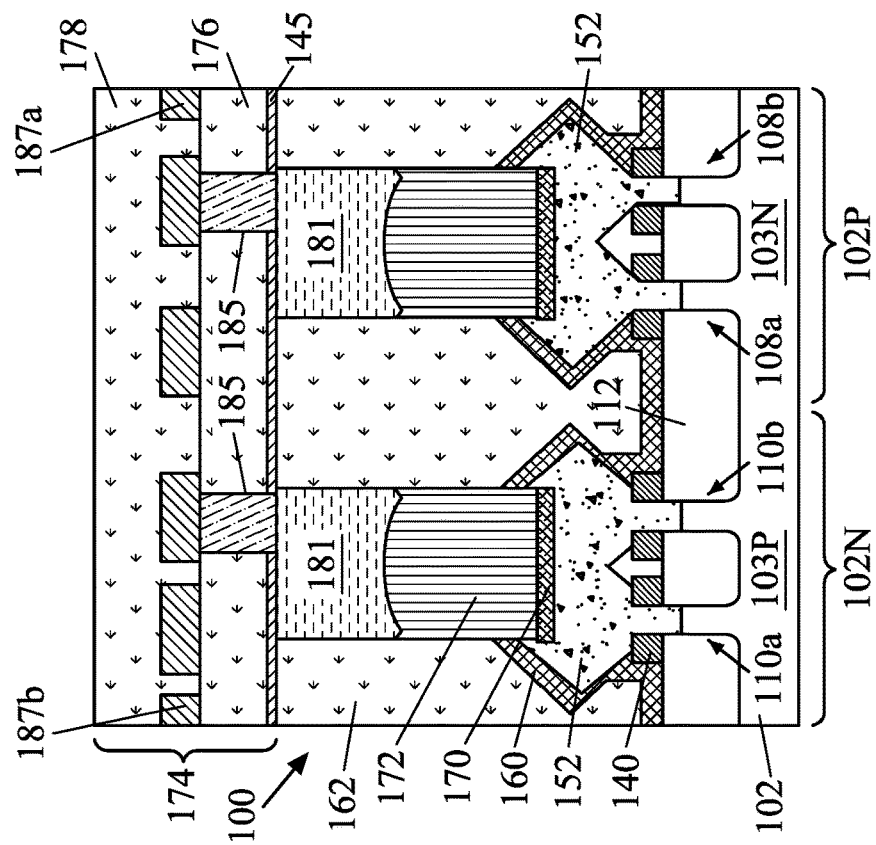
Figure 18B:
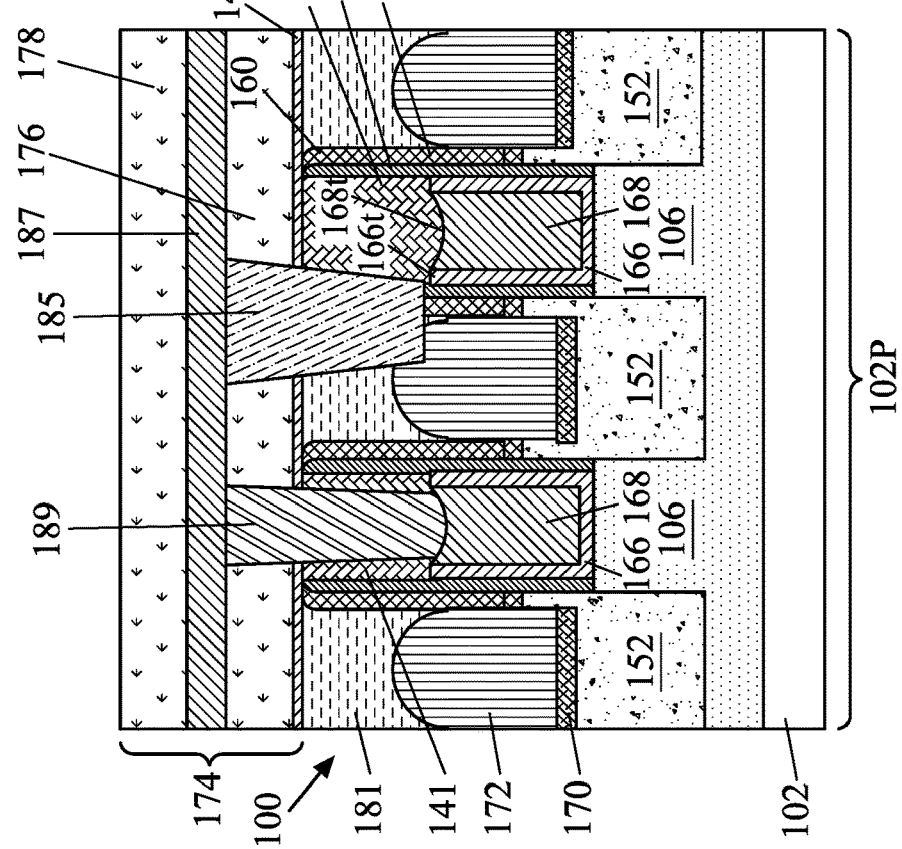

FIGS. 15B-1 is an enlarged view of a portion of the replacement gate structure in accordance with some embodiments. As can been seen, the vertical interconnect feature 185 is misaligned with the conductive feature 172 (FIG. 15B) and has a portion overlapping the first dielectric cap layer 141 disposed over the gate dielectric layer 166 and the gate electrode layer 168. Since the gate electrode layer 168 has a convex top surface 168t, a slight to moderate misalignment of the vertical interconnect feature 185 with the conductive feature 172 would not result in the vertical interconnect feature 185 being connected with the gate electrode layer 168. FIG. 15B-2 is an enlarged view showing a portion of the semiconductor device structure adjacent the gate electrode layer 168 in accordance with some embodiments. As can be seen, the first dielectric cap layer 141 is at least in contact with the sidewall 140s of the gate spacer 140, the top surface 166t and the corner surface 171 of the gate dielectric layer 166, and the top surface 168t of the gate electrode layer 168. The first dielectric cap layer 141 has a concave (i.e., rounded inward) bottom with two edge portions each extending into a region between the gate spacer 140 and the gate dielectric layer 166. The distal end of the edge portions of the first dielectric cap layer 141 has a rounded or curved surface defined by the curvature of the corner surface 171, which is formed as a result of the formation of the micro-trench 169 as discussed above. It should be noted that while both the gate electrode layer 168 and the conductive feature 172 are shown with a convex top surface, in some embodiments the conductive feature 172 may have a flat top surface. Alternatively, the conductive feature 172 may have a convex top surface while the gate electrode layer 168 may have a convex top surface, such as an example shown in FIG. 16A. In some embodiments, the conductive feature 172 may have a concave top surface, while the gate electrode layer 168 may have a convex top surface, as an example shown in FIG. 17A. In some embodiments the gate electrode layer 168 may have a concave top surface, while the conductive feature 172 may have a convex top surface, as an example shown in FIG. 18A.

FIGS. 16A and 16B illustrate a cross-sectional view of the semiconductor device structure 100 in accordance with an alternative embodiment of the present disclosure. The embodiment shown in FIGS. 16A and 16B are identical to the embodiment shown in FIGS. 15A and 15B except that the gate dielectric layer 166 and the gate electrode layer 168 have a substantial flat surface profile, as discussed above with respect to FIG. 10B-3. Likewise, since the top surface 166t of the gate dielectric layer 166 is etched to have a height lower than that of the top surface 168t of the gate electrode layer 168, a slight to moderate misalignment of the vertical interconnect feature 185 with the conductive feature 172 would not result in the vertical interconnect feature 185 being connected with the gate electrode layer 168. Therefore, vertical interconnect feature-to-gate electrode layer leakage is avoided, and the performance of the device is improved.

The present disclosure provides an improved semiconductor device structure to prevent source/drain contact via-to-gate leakage by forming gate electrode layers with a convex top surface profile. The convex top surface of the gate electrode layer avoids unwanted connection with source/drain contact via even if the source/drain contact via is misaligned with the source/drain contact. In addition, the convex top surface of the gate electrode layer shortens the distance to metal gate contact vias, allowing easier landing of the metal gate contact vias on the gate electrode layer as compared to gate electrode layers with a concave top surface profile. The convex surface profile of the gate electrode layers 168/conductive features 172 may be achieved using ICP, CCP, or microwave plasma source with lower pressure and/or higher RF bias power. An implantation is provided after plasma etch process to promote micro-trenching phenomenon at or near the edges of the gate electrode layers/conductive features.

An embodiment is a semiconductor device structure. The semiconductor device structure includes a first gate dielectric layer having a top surface and a corner surface, wherein a highest point of the top surface of the first gate dielectric layer is at a first elevation. The semiconductor device structure also includes a first gate electrode layer having a top surface, wherein a highest point of the top surface of the first gate electrode layer is at a second elevation higher than the first elevation. The semiconductor device structure further includes a first dielectric cap layer in contact with the top surface and the corner surface of the first gate dielectric layer. The first dielectric cap layer is also in contact with the top surface of the first gate electrode layer. The semiconductor device structure further includes a first gate spacer in contact with the first dielectric cap layer and the first gate dielectric layer.

Another embodiment is a semiconductor device structure. The semiconductor device structure includes a source/drain epitaxial feature, a conductive feature in contact with the source/drain epitaxial feature, wherein a top surface of the conductive feature has a convex profile. The semiconductor device structure includes a first dielectric cap layer in contact with the top surface of the conductive feature. The semiconductor device structure includes a first gate dielectric layer and a first gate electrode layer being surrounded by the first gate dielectric layer, wherein the first gate electrode layer has a top surface that is higher than a top surface of the first gate dielectric layer. The semiconductor device structure includes a second dielectric cap layer in contact with the top surfaces of the first gate electrode layer and the first gate dielectric layer, and a first gate spacer in contact with the second dielectric cap layer and the first gate dielectric layer.

A further embodiment is a method. The method includes forming a plurality of fin structures from a substrate, forming a plurality of sacrificial gate structures over a portion of each of the plurality of fin structures, forming a gate spacer on opposing sides of each of the plurality of the sacrificial gate structures, removing portions of the plurality of fin structures not covered by the sacrificial gate structures and the gate spacers, forming a source/drain feature in regions created as a result of removal of the portions of the fin structures, forming sequentially a contact etch stop layer (CESL) and an interlayer dielectric on the source/drain feature, removing the sacrificial gate structure to expose a portion of the plurality of fin structures, forming sequentially a gate dielectric layer and a gate electrode layer on exposed portion of the plurality of fin structures. The method also includes removing portions of the gate electrode layer and the gate dielectric layer so that a top surface of the gate electrode layer is higher than a top surface of the gate dielectric layer, wherein a micro-trench is formed at or near an interface between the gate spacer and the gate dielectric layer, and a bottom of the micro-trench has a smooth rounded surface profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a first gate dielectric layer having a top surface and a corner surface, wherein a highest point of the top surface of the first gate dielectric layer is at a first elevation;
   a first gate electrode layer having a top surface, wherein a highest point of the top surface of the first gate electrode layer is at a second elevation higher than the first elevation;
   a first dielectric cap layer having a bottom in contact with the top surface and the corner surface of the first gate dielectric layer and the top surface of the first gate electrode layer; and
   a first gate spacer in contact with the first dielectric cap layer and the first gate dielectric layer,
   wherein the bottom of the first dielectric cap layer comprises two edge portions each extending into a region between the first gate spacer and the first gate dielectric layer, and a distal end of the edge portions has a curved surface.

2. The semiconductor device structure of claim 1, wherein the top surface of the first gate electrode layer has a convex profile.

3. The semiconductor device structure of claim 1, wherein a bottom of the first dielectric cap layer has a concave rounded inward profile.

4. The semiconductor device structure of claim 1, wherein the first gate spacer and the first gate dielectric layer meet at a point having a third elevation, and a distance between second elevation and the third elevation is in a range of about 1 nm and about 15 nm.

5. The semiconductor device structure of claim 1, wherein top surface of the first gate dielectric layer has a first curvature, and the corner surface has a second curvature greater than the first curvature.

6. The semiconductor device structure of claim 1, further comprising:
   a second gate dielectric layer having a top surface and a corner surface, a highest point of the top surface of the second gate dielectric layer being at a fourth elevation;
   a second gate electrode layer having a top surface, a highest point of the top surface of the second gate electrode layer being at a fifth elevation higher than the fourth elevation;
   a second dielectric cap layer disposed on the second gate electrode layer and the second gate dielectric layer;
   a second gate spacer in contact with the second dielectric cap layer and the second gate dielectric layer; and
   an interconnect feature extending through the second dielectric cap layer and in contact with the second gate electrode layer.

7. The semiconductor device structure of claim 6, wherein the second dielectric cap layer has an edge portion extending into a region between the second gate spacer and the second gate dielectric layer, and a distal end of the edge portion has a rounded or curved surface.

8. A semiconductor device structure, comprising:
   a source/drain epitaxial feature;
   a conductive feature in contact with the source/drain epitaxial feature, wherein a top surface of the conductive feature has a convex profile;
   a first dielectric cap layer having a bottom in contact with the top surface of the conductive feature;
   a first gate dielectric layer;
   a first gate electrode layer being surrounded by the first gate dielectric layer, wherein the first gate electrode layer has a top surface that is higher than a top surface of the first gate dielectric layer;
   a second dielectric cap layer in contact with the top surfaces of the first gate electrode layer and the first gate dielectric layer; and
   a first gate spacer in contact with the second dielectric cap layer and the first gate dielectric layer,
   wherein the bottom of the first dielectric cap layer comprises two edge portions each extending into a region between the first gate spacer and the first gate dielectric layer, and a distal end of the edge portions has a rounded or curved surface.

9. The semiconductor device structure of claim 8, wherein the top surface of the first gate electrode layer has a convex profile.

10. The semiconductor device structure of claim 8, wherein the bottom of the first dielectric cap layer has a concave rounded inward profile, and the bottom is in contact with the top surfaces of the first gate electrode layer and the first gate dielectric layer.

11. The semiconductor device structure of claim 8, further comprising:
    a second gate dielectric layer having a top surface and a corner surface;
    a second gate electrode layer having a top surface, wherein the top surface of the second gate electrode layer is higher than the top surface of the second gate dielectric layer;
    a third dielectric cap layer disposed on the second gate electrode layer and the second gate dielectric layer;
    a second gate spacer in contact with the second dielectric cap layer and the second gate dielectric layer; and
    a first interconnect feature extending through the third dielectric cap layer and in contact with the second gate electrode layer.

12. The semiconductor device structure of claim 11, wherein the third dielectric cap layer has an edge portion extending into a region between the second gate spacer and the second gate dielectric layer, and a distal end of the edge portion has a rounded or curved surface.

13. The semiconductor device structure of claim 11, wherein the second and third dielectric cap layers are formed of a first material, and the first dielectric cap layer is formed of a second material chemically different than the first material.

14. The semiconductor device structure of claim 11, further comprising:
   a contact etch stop layer (CESL) in contact with the conductive feature, the first dielectric cap layer, and the first gate spacer; and
   a second interconnect feature extending through a portion of the first dielectric cap layer and in contact with the conductive feature, the second dielectric cap layer, the first gate spacer, and the CESL,
   wherein the second interconnect feature is separated from the first gate electrode layer by the second dielectric cap layer.

15. A semiconductor device structure, comprising:
   a gate dielectric layer having a top surface, wherein a highest point of the top surface of the gate dielectric layer is at a first elevation;
   a gate electrode layer having a top surface, wherein a highest point of the top surface of the gate electrode layer is at a second elevation higher than the first elevation;
   a gate spacer in contact with the gate dielectric layer, wherein a first point where the gate spacer and the top surface of the gate dielectric layer meets is at a fourth elevation that is lower than a second point where the gate dielectric layer and the gate electrode layer meets a dielectric cap layer disposed above the top surface of the gate dielectric layer and the top surface of the gate electrode layer; and
   a source/drain contact having a bottom surface, wherein the bottom surface is disposed at a third elevation higher than the first elevation.

16. The semiconductor device structure of claim 15, wherein sidewalls of the gate spacer, the top surface of in contact with the gate dielectric layer, and the top surface of the gate electrode layer define a micro-trench, and the micro-trench has a bottom with a curved surface profile.

17. The semiconductor device structure of claim 16, wherein the bottom surface of the source/drain contact comprises:
   a first portion in contact with the gate spacer; and
   a second portion in contact with the dielectric cap layer.

18. The semiconductor device structure of claim 15, wherein the top surface of the gate electrode layer has a convex profile.

* * * * *